US012395582B2

(12) United States Patent
An et al.

(10) Patent No.: US 12,395,582 B2
(45) Date of Patent: Aug. 19, 2025

(54) ELECTRONIC DEVICE INCLUDING WATERPROOF STRUCTURE

(71) Applicant: SAMSUNG ELECTRONICS CO., LTD., Suwon-si (KR)

(72) Inventors: Jungchul An, Suwon-si (KR); Seonghoon Kim, Suwon-si (KR); Hyunho Shin, Suwon-si (KR); Hyunju Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 471 days.

(21) Appl. No.: 17/885,945

(22) Filed: Aug. 11, 2022

(65) Prior Publication Data

US 2023/0051260 A1 Feb. 16, 2023

Related U.S. Application Data

(63) Continuation of application No. PCT/KR2022/011556, filed on Aug. 4, 2022.

(30) Foreign Application Priority Data

Aug. 10, 2021 (KR) .................. 10-2021-0105015

(51) Int. Cl.
*H04M 1/02* (2006.01)
*G06F 1/16* (2006.01)
*H04M 1/18* (2006.01)

(52) U.S. Cl.
CPC ............ *H04M 1/18* (2013.01); *G06F 1/1616* (2013.01); *G06F 1/1652* (2013.01);
(Continued)

(58) Field of Classification Search
CPC .... H04M 1/18; H04M 1/0216; H04M 1/0268; H04M 1/02; H04M 1/0277; G06F 1/1616;
(Continued)

(56) References Cited

U.S. PATENT DOCUMENTS

| 2005/0225952 | A1* | 10/2005 | Takagi | ................ | H04M 1/18 361/749 |
| 2011/0110022 | A1* | 5/2011 | Kumagai | ............. | H04M 1/18 361/679.01 |

(Continued)

FOREIGN PATENT DOCUMENTS

| EP | 3151524 | 4/2017 |
| EP | 3771186 | 1/2021 |

(Continued)

OTHER PUBLICATIONS

Extended European Search Report dated Oct. 4, 2024 issued in European Patent Application No. 22856105.6.

(Continued)

*Primary Examiner* — Angelica Perez
(74) *Attorney, Agent, or Firm* — Nixon & Vanderhye P.C.

(57) ABSTRACT

According to various embodiments, an electronic device may include: a first housing including a first support member, a second housing including a second support member and foldably coupled to the first housing through a hinge device, a display panel supported by the first housing and the second housing, a support plate disposed under the display panel, a first reinforced plate at least partially disposed under the support plate to correspond to the first support member, a second reinforced plate at least partially disposed under the support plate to correspond to the second support member, a first waterproof structure disposed between the first housing and the first reinforced plate to define at least one first waterproof space, and a second waterproof structure disposed between the second housing and the second reinforced plate to define at least one second waterproof space.

20 Claims, 18 Drawing Sheets

(52) U.S. Cl.
CPC ........ *G06F 1/1656* (2013.01); *H04M 1/0216* (2013.01); *H04M 1/0268* (2013.01)

(58) Field of Classification Search
CPC .... G06F 1/1652; G06F 1/1656; G06F 1/1637; G06F 3/041; G06F 1/1658; G06F 1/1681; G06F 3/0412; H05K 5/06; H05K 5/061
See application file for complete search history.

(56) References Cited

U.S. PATENT DOCUMENTS

| | | |
|---|---|---|
| 2015/0282364 A1 | 10/2015 | Moon et al. |
| 2018/0006064 A1 | 1/2018 | Miyaguchi |
| 2018/0076412 A1 | 3/2018 | Kim et al. |
| 2018/0241861 A1 | 8/2018 | Kim et al. |
| 2018/0249588 A1 | 8/2018 | Choi et al. |
| 2018/0335679 A1 | 11/2018 | Hashimoto et al. |
| 2019/0181194 A1 | 6/2019 | Wu et al. |
| 2020/0162596 A1* | 5/2020 | Kim .................... G06F 1/1683 |
| 2020/0236826 A1* | 7/2020 | Baek .................... H01F 27/366 |
| 2020/0319672 A1 | 10/2020 | Kim et al. |
| 2021/0029841 A1 | 1/2021 | Kim et al. |
| 2021/0116964 A1 | 4/2021 | Moon et al. |
| 2021/0176872 A1 | 6/2021 | Woo et al. |
| 2022/0164002 A1 | 5/2022 | An et al. |
| 2023/0047246 A1* | 2/2023 | An ............................ H05K 5/06 |
| 2023/0180413 A1* | 6/2023 | An ........................ G06F 1/1652 |
| | | 345/905 |
| 2023/0262914 A1* | 8/2023 | Kang .................... G06F 1/1681 |
| | | 361/807 |

FOREIGN PATENT DOCUMENTS

| | | |
|---|---|---|
| JP | 2020522730 | 7/2020 |
| JP | 2021107929 | 7/2021 |
| KR | 10-2018-0029190 | 3/2018 |
| KR | 10-2018-0096178 | 8/2018 |
| KR | 10-2020-0062827 | 6/2020 |
| KR | 10-2020-0108754 | 9/2020 |
| KR | 10-2021-0012930 | 2/2021 |
| KR | 10-2021-0047753 | 4/2021 |
| KR | 10-2021-0070880 | 6/2021 |
| WO | 2020/171449 | 8/2020 |

OTHER PUBLICATIONS

Korean Notice of Allowance issued Jun. 27, 2024 in corresponding Korean Patent Application No. 10-2021-0105015.
Search Report and Written Opinion dated Aug. 10, 2022 issued in International Patent Application No. PCT/KR2022/011556.

\* cited by examiner

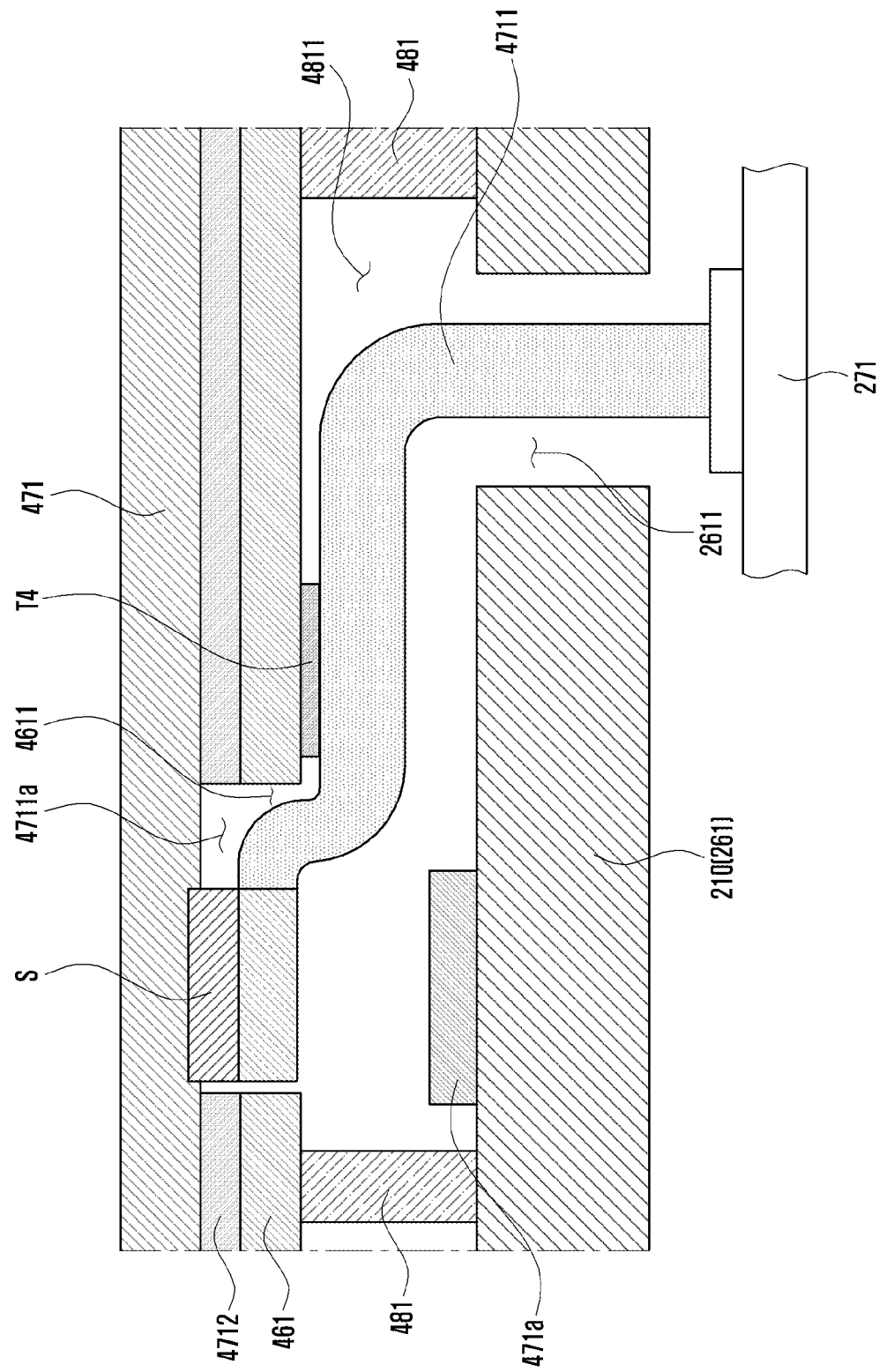

ELECTRONIC DEVICE INCLUDING WATERPROOF STRUCTURE

CROSS-REFERENCE TO RELATED APPLICATIONS

This application is a continuation of International Application No. PCT/KR2022/011556 designating the United States, filed on Aug. 4, 2022, in the Korean Intellectual Property Receiving Office and claiming priority to Korean Patent Application No. 10-2021-0105015, filed on Aug. 10, 2021, in the Korean Intellectual Property Office, the disclosures of which are incorporated by reference herein in their entireties.

BACKGROUND

Field

The disclosure relates to an electronic device including a waterproof structure.

Description of Related Art

Electronic devices are becoming slim and are being enhanced to differentiate functional elements of thereof while the rigidity and design aspects are developed. The electronic devices may require a sealed waterproof and/or dustproof structure for preventing/reducing electronic components arranged inside the electronic devices from being damaged by water and/or foreign materials.

An electronic device may include a first housing, a second housing foldably coupled to the first housing through a hinge device (e.g., a hinge module), and a flexible display disposed to be supported by the first housing and the second housing. When the first housing and the second housing are folded with respect to each other, an area of the flexible display, corresponding to the hinge device, may be bent.

An electronic device may include a waterproof member (e.g., waterproof tape) disposed between the first housing and the flexible display and disposed between the second housing and the flexible display. The electronic device may include a waterproof structure in which a part of an area corresponding to the first housing and/or an area corresponding to the second housing is sealed through the waterproof member. These areas may include areas in which permeation of water should be necessarily prevented, in a folding structure of the electronic device, in which water is easily introduced into a folding area.

However, a waterproof structure in which a waterproof member is disposed between a housing and a flexible display may become a cause of a damage (e.g., tearing) of the flexible display by a strong adhesive force of the waterproof member when the flexible display is to be separated from housings for maintenance of the electronic device. In addition, when the waterproof member is directly applied to a rear surface of the flexible display, the waterproof member may be visible from the outside of the flexible display, or a problem of deterioration in a surface quality may occur. In addition, when a digitizer is applied under a display panel of the flexible display, the waterproof member may be disposed between the digitizer and the housing, but this may cause deterioration in a waterproof function due to a pattern step (e.g., a coil pattern) of the digitizer.

SUMMARY

Embodiments of the disclosure may provide an electronic device including a waterproof function which can prevent and/or reduce a flexible display from being damaged and thus can assist in maintenance.

Embodiments of the disclosure may provide an electronic device including a waterproof structure which can assist in enhancing a surface quality.

Embodiments of the disclosure may provide an electronic device including a waterproof structure which can assist in enhancing a waterproof performance.

However, a problem addressed by the disclosure is not limited to the problems mentioned above, and may be variously expanded without departing from the idea and the scope of the disclosure.

According to various example embodiments, an electronic device may include: a first housing including a first support member, a second housing including a second support member and foldably coupled to the first housing through a hinge device, a display panel supported by the first housing and the second housing, a support plate disposed under the display panel, a first reinforced plate at least partially disposed under the support plate to correspond to the first support member, a second reinforced plate at least partially disposed under the support plate to correspond to the second support member, a first waterproof structure disposed between the first housing and the first reinforced plate to define at least one first waterproof space, and a second waterproof structure disposed between the second housing and the second reinforced plate to define at least one second waterproof space.

According to various example embodiments, an electronic device may include: a first housing including a first support member, a second housing including a second support member and foldably coupled to the first housing through a hinge device, a display panel supported by the first housing and the second housing, a support plate disposed under the display panel, a first digitizer disposed under the support plate to correspond to the first support member, and including a first flexible printed circuit board (FPCB) connection portion, a second digitizer disposed under the support plate to correspond to the second support member, and including a second FPCB connection portion, a first reinforced plate disposed under the first digitizer to correspond to the first support member, a second reinforced plate disposed under the second digitizer to correspond to the second support member, a first waterproof structure disposed between the first housing and the first reinforced plate to define at least one first waterproof space, and a second waterproof structure disposed between the second housing and the second reinforced plate to define at least one second waterproof space, wherein the first FPCB connection portion is disposed, when seen from above the flexible display, at a position overlapping with the at last one first waterproof space, and the second FPCB connection portion is disposed, when seen from above the flexible display, at a position overlapping with the at least one second waterproof space.

An electronic device according to various example embodiments of the disclosure may include reinforced plates arranged under a flexible display, and include a waterproof structure in which at least one waterproof member is disposed between a reinforced plate and a housing, and thus, during maintenance, a phenomenon in which the flexible display is damaged by an adhesive force of the waterproof member can be reduced, a surface quality of the flexible display can be enhanced, and a deterioration in a waterproof function can be reduced even when a digitizer is disposed.

Various other effects directly or indirectly identified through the disclosure can be provided.

BRIEF DESCRIPTION OF THE DRAWINGS

With regard to description of drawings, the same or similar reference numerals may be used for the same or similar elements. Further, the above and other aspects, features and advantages of certain embodiments of the present disclosure will be more apparent from the following detailed description, taken in conjunction with the accompanying drawings, in which:

FIG. 8B is a cross-sectional view of a part of an electronic device, illustrating a state in which an FPCB connection portion is disposed through area 8b in FIG. 6 and area 8b in FIG. 7, according to various embodiments;

DETAILED DESCRIPTION

Figure 1A:
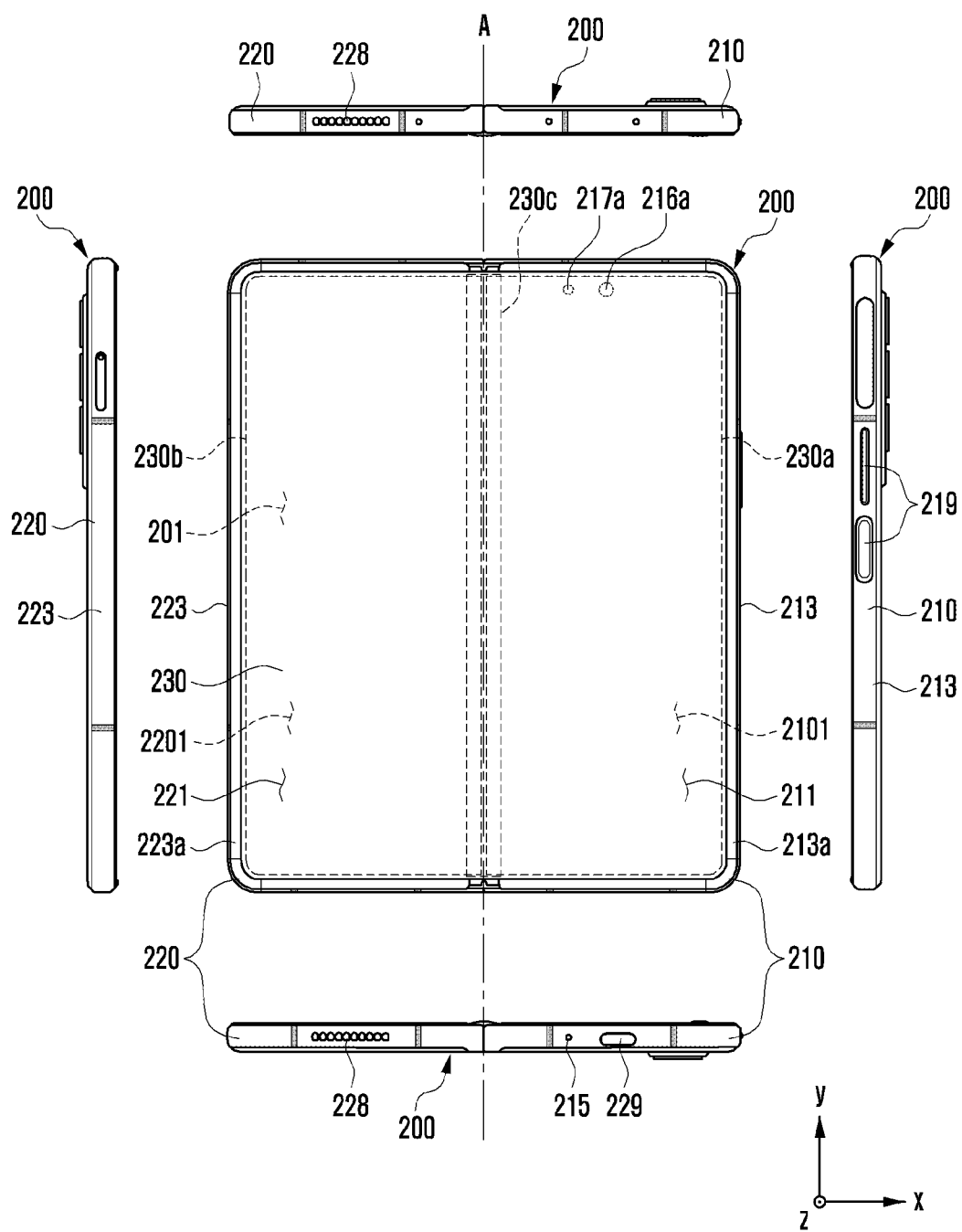
FIGS. 1A and 1B are diagrams illustrating a front view and a rear view, respectively, of an unfolded state of an electronic device according to various embodiments.
Figure 1B:
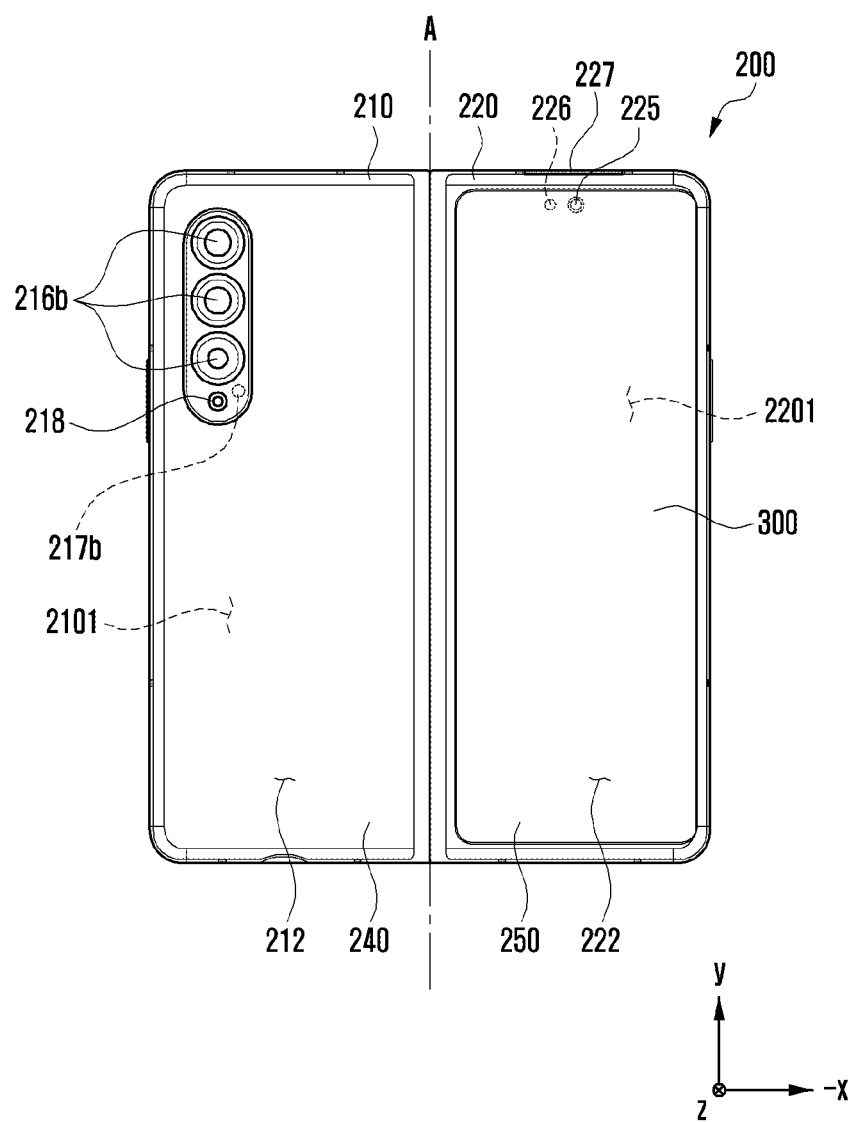
Figure 2A:
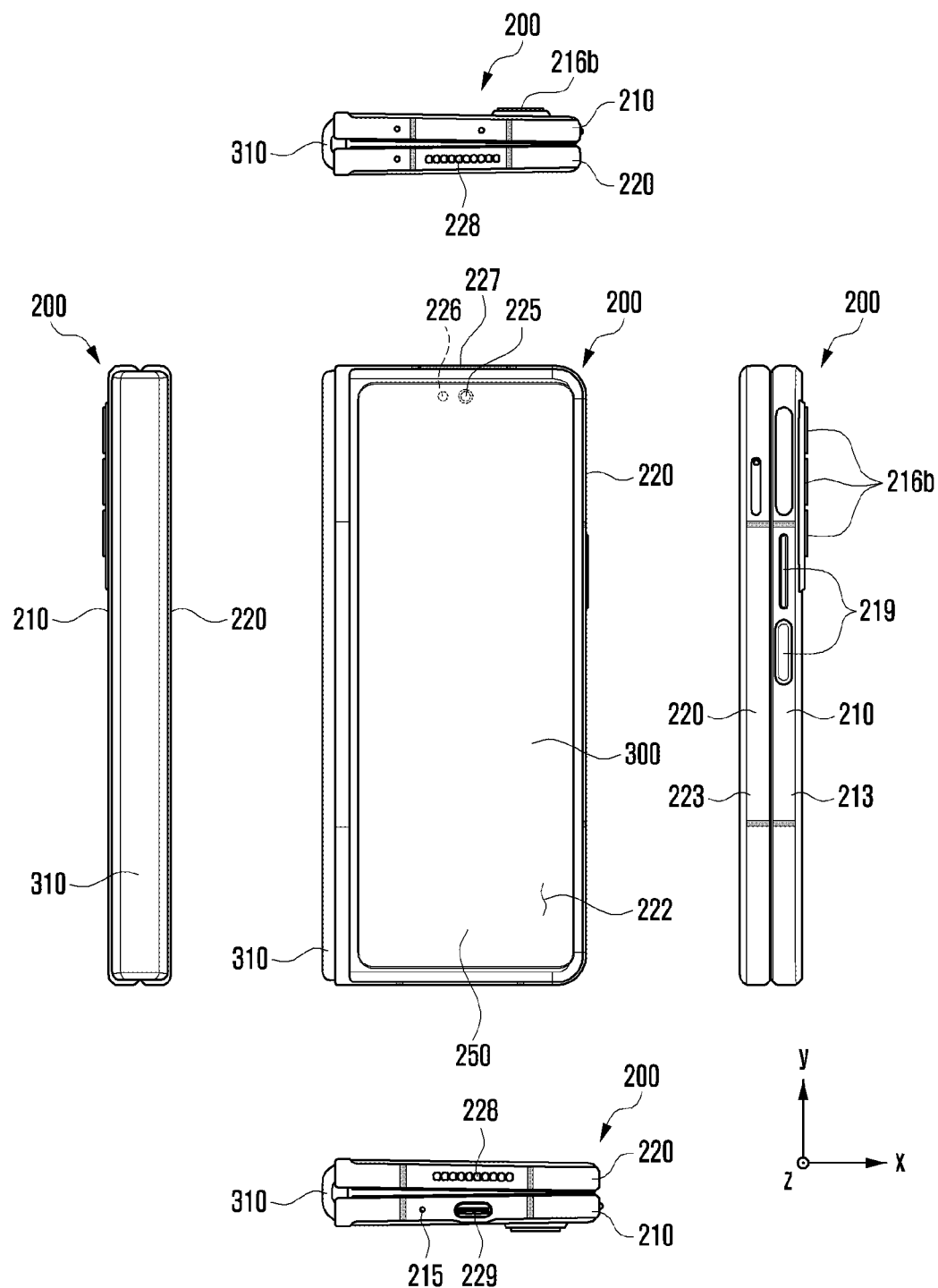
FIGS. 2A and 2B are diagrams illustrating a front view and a rear view, respectively, of a folded state of an electronic device according to various embodiments.
Figure 2B:
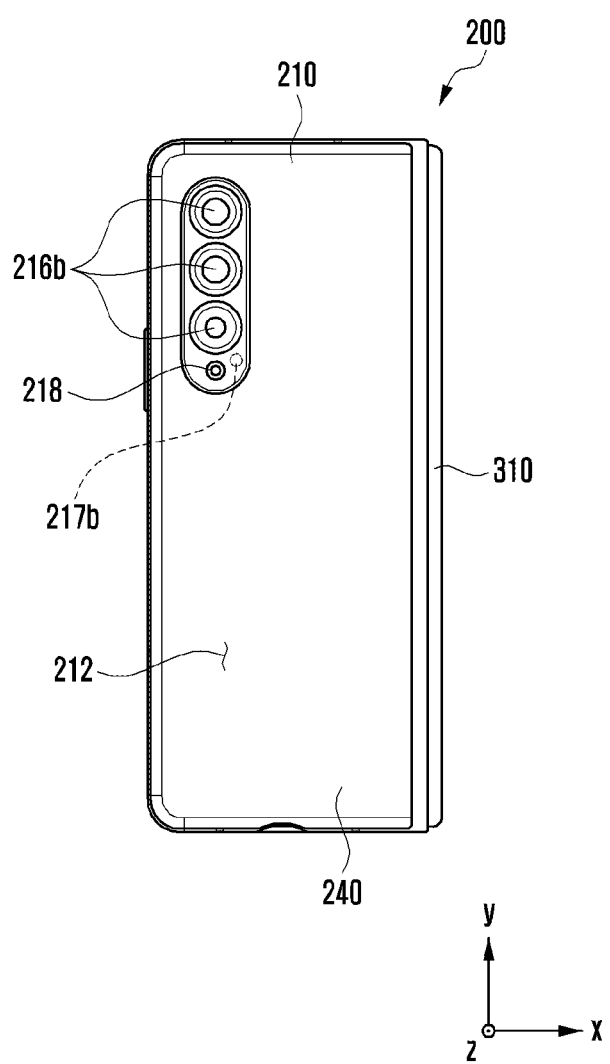

FIGS. 1A and 1B are diagrams illustrating a front view and a rear view, respectively, of an unfolded state of an electronic device according to various embodiments. FIGS. 2A and 2B are diagrams illustrating a front view and a rear view, respectively, of a folded state of an electronic device according to various embodiments.

Referring to FIGS. 1A, 1B, 2A and 2B (which may be referred to as FIGS. 1A to 2B), an electronic device 200 may include a pair of housings 210 and 220 (e.g., a foldable housing structure) rotatably coupled to each other with reference to folding axis A through a hinge device (e.g., a hinge device 320 of FIG. 3) (e.g., a hinge module) so as to be folded with respect to each other, a first display 230 (e.g., a flexible display, a foldable display, or a main display) disposed through the pair of housings 210 and 220, and/or a second display 300 (e.g., a sub display) disposed through the second housing 220. According to an embodiment, at least a part of the hinge device (e.g., the hinge device 320 of FIG. 3) may be disposed so as not to be seen from the outside through the first housing 210 and the second housing 220, and may be disposed so as not to be seen from the outside through the hinge housing 310 covering a foldable portion. According to an embodiment, the hinge device 320 may include a hinge module including a gear assembly including multiple gears and multiple hinge cams which are coupled to hinge shafts rotating through the gear assembly and perform a cam interlocking operation, and hinge plates for connecting the hinge model to the first housing 210 and the second housing 220. In the disclosure, a surface in which the first display 230 is disposed may be defined as a front surface of the electronic device 200, and a surface opposite to the front surface may be defined as a rear surface of the electronic device 200. In addition, a surface surrounding a space between the front surface and the rear surface may be defined as a side surface of the electronic device 200.

Figure 3:
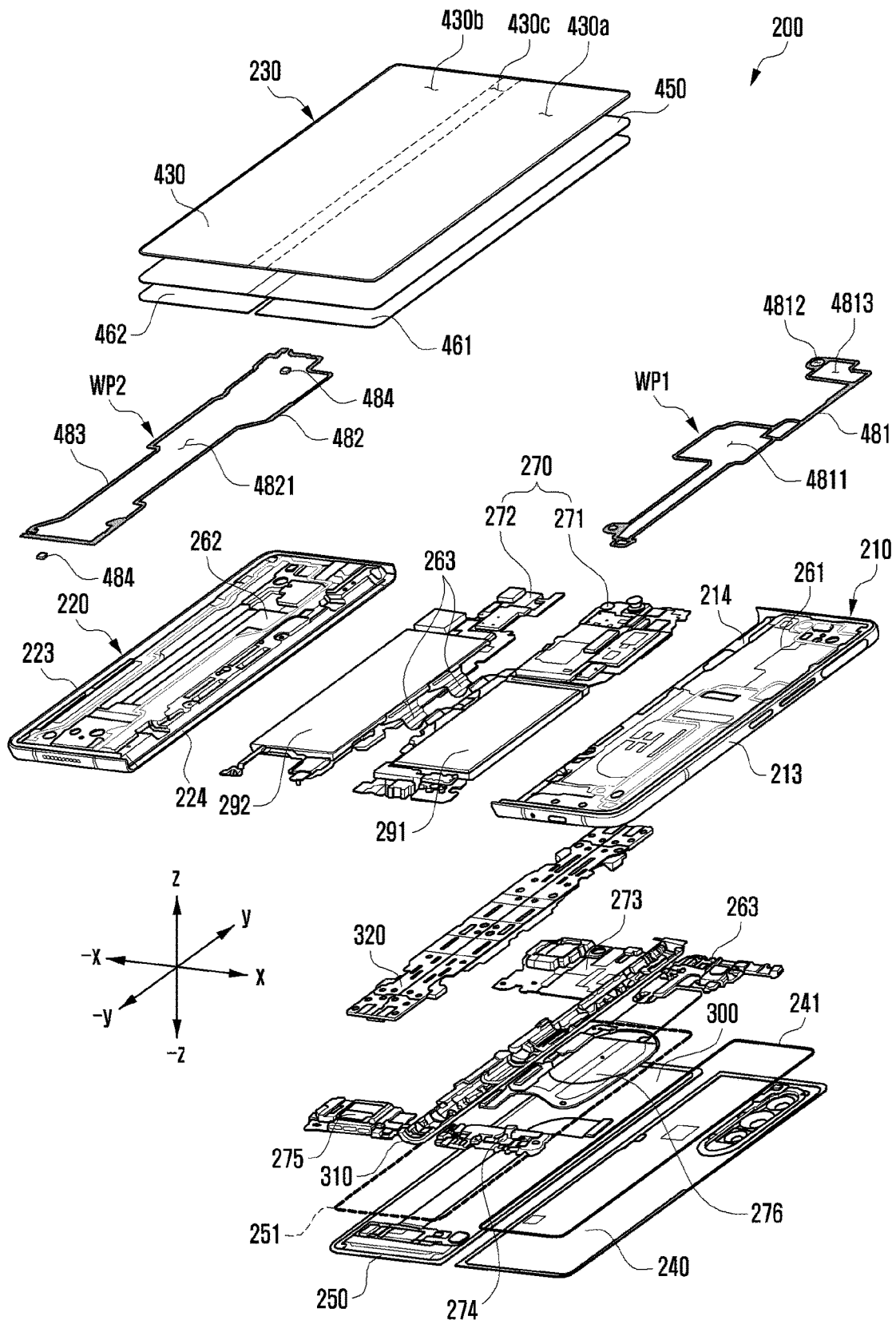
FIG. 3 is an exploded perspective view illustrating an electronic device according to various embodiments.

According to various embodiments, the pair of housings 210 and 220 may include a first housing 210 and a second housing 220 foldably arranged with respect to each other through the hinge device (e.g., the hinge device 320 of FIG. 3). According to an embodiment, the shape and the coupling of the pair of housings 210 and 220 are not limited to those illustrated in FIGS. 1A to 2B, and the pair of housings 210 and 220 may be implemented by a combination and/or coupling of other shapes or components. According to an embodiment, the first housing 210 and the second housing 220 may be arranged on opposite sides with reference to the folding axis A, and may have shapes that are entirely symmetric to each other with respect to the folding axis A. According to an embodiment, the first housing 210 and the second housing 220 may be asymmetrically folded with reference to the folding axis A. According to an embodiment, the angle or the distance between the first housing 210 and the second housing 220 may vary depending on whether the electronic device 200 is in an unfolded state, a folded state, or an intermediate state.

According to various embodiments, the first housing 210 may include, in the unfolded state of the electronic device 200, a first surface 211 connected to the hinge device (e.g., the hinge device 320 of FIG. 3) and disposed to be oriented to the front surface of the electronic device 200, a second surface 212 oriented in a direction opposite to the first surface 211, and/or a first side member 213 surrounding at least a part of a first space between the first surface 211 and the second surface 212. According to an embodiment, the second housing 220 may include, in the unfolded state of the electronic device 200, a third surface 221 connected to the hinge device (e.g., the hinge device 320 of FIG. 3) and disposed to be oriented to the front surface of the electronic device 200, a fourth surface 222 oriented in a direction opposite to the third surface 221, and/or a second side member 223 surrounding at least a part of a second space between the third surface 221 and the fourth surface 222. According to an embodiment, the first surface 211 and the third surface 221 may be oriented in substantially the same direction in the unfolded state, and the first surface 211 and the third surface 221 may at least partially face each other in the folded state. According to an embodiment, the electronic device 200 may include a recess 201 formed to receive the first display 230 through structural coupling of the first housing 210 and the second housing 220. According to an embodiment, the recess 201 may have substantially the same shape as the first display 230. According to an embodiment, the first housing 210 may include a first protection frame 213a (e.g., a first decoration member) which is, when seen from above the first display 230, coupled to the first side member 213, disposed to overlap with an edge of the first display 230, so as to cover the edge of the first display 230 to allow the same not to be seen from the outside. According to an embodiment, the first protection frame 213a may be integrally formed with the first side member 213. According to an embodiment, the second housing 220 may include a second protection frame 223a (e.g., a second decoration member) which is, when seen from above the first display 230, coupled to the second side member 223, disposed to overlap with an edge of the first display 230, so as to cover the edge of the first display 230 to allow the same not to be seen from the outside. According to an embodiment, the second protection frame 223a may be integrally formed with the first side member 223. In an embodiment, the first protection frame 213a and the second protection frame 223a may be omitted.

According to various embodiments, the hinge housing 310 (e.g., a hinge cover) may be disposed between the first housing 210 and the second housing 220, and may be disposed to cover a part (e.g., at least one hinge module) of the hinge device (e.g., the hinge device 320 of FIG. 3) disposed on the hinge housing 310. According to an embodiment, the hinge housing 310 may be hidden or exposed from or to the outside by a part of the first housing 210 and the second housing 220 according to the unfolded state, the folded state, or the intermediate state of the electronic device 200. For example, when the electronic device 200 is in the unfolded state, at least a part of the hinge housing 310 may be covered by the first housing 210 and the second housing 220 and not be substantially exposed. According to an embodiment, when the electronic device 200 is in the folded state, at least a part of the hinge housing 310 may be exposed to the outside between the first housing 210 and the second housing 220. According to an embodiment, in the intermediate state in which the first housing 210 and the second housing 220 are folded with each other by a predetermined angle (folded with a certain angle), the hinge housing 310 may be at least partially exposed to the outside of the electronic device 200 between the first housing 210 and the second housing 220. For example, an area in which the hinge housing 310 is exposed to the outside, may be smaller than that in a case in which the electronic device 200 is completely folded. According to an embodiment, the hinge housing 310 may include a curved surface.

According to various embodiments, when the electronic device 200 is in the unfolded state (e.g., the states shown in FIGS. 1A and 1B), the first housing 210 and the second housing 220 may meet at an about 180-degree angle, and a first area 230a, a second area 230b, and a folding area 230c of the first display 230 may form the same plane and arranged to be oriented in substantially the same direction (e.g., a z-axis direction). In an embodiment, when the electronic device 200 is in the unfolded state, the first housing 210 may rotate by an about 360-degree angle with respect to the second housing 220, and may be outwardly folded (an out-folding scheme) so that the second surface 212 and the fourth surface 222 face each other.

According to various embodiments, when the electronic device 200 is in the folded state (e.g., the states shown in FIGS. 2A and 2B), the first surface 211 of the first housing 210 and the third surface 221 of the second housing 220 may be arranged to face each other. In this case, the first area 230a and the second area 230b of the first display 230 may form a narrow angle (e.g., a range between 0 degrees to about 10 degrees) through the folding area 230c, and may be arranged to face each other. According to an embodiment, at least a part of the folding area 230c may be deformed into a curved shape having a predetermined curvature. According to an embodiment, when the electronic device 200 is in the intermediate state, the first housing 210 and the second housing 220 may be arranged at a predetermined angle (a certain angle). In this case, the first area 230a and the second area 230b of the first display 230 may form an angle that is greater than that in the folded state and smaller than that in the unfolded state, and the curvature of the folding area 230c may be lower than that in the folded state, and may be higher than that in the unfolded state. In an embodiment, the first housing 210 and the second housing 220 may form an angle which allows stopping at a designated folding angle between the folded state and the unfolded state (a free stop function), through the hinge device (e.g., the hinge device 320 of FIG. 3). In an embodiment, the first housing 210 and the second housing 220 may continuously operate while being pressed in an unfolding direction or a folding direction with reference to a designated inflection angle, through the hinge device (e.g., the hinge device 320 of FIG. 3).

According to various embodiments, the electronic device 200 may include at least one of at least one display 230 and 300 disposed on the first housing 210 and/or the second housing 220, an input device 215, sound output devices 227 and 228, sensor modules 217a, 217b, and 226, camera modules 216a, 216b, and 225, a key input device 219, an indicator (not shown), or a connector port 229. In an embodiment, the electronic device 200 may omit at least one of the elements, or may additionally include at least one another element.

According to various embodiments, the at least one display 230 and 300 may include a first display 230 (e.g., a flexible display) disposed to be supported by the third surface 221 of the second housing 220 from the first surface 211 of the first housing 210 through the hinge device (e.g., the hinge device 320 of FIG. 3), and a second display 300 disposed to be at least partially seen from the outside through the fourth surface 222 in a space in the second housing 220. In an embodiment, the second display 300 may be disposed to be seen from the outside through the second surface 212 in a space in the first housing 210. According to an embodiment, the first display 230 may be mainly used in the unfolded state of the electronic device 200, and the second display 300 may be mainly used in the folded state of the electronic device 200. According to an embodiment, the electronic device 200 may control, in the intermediate state, the first display 230 and/or the second display 300 to be used, based on a folding angle between the first housing 210 and the second housing 220.

According to various embodiments, the first display 230 may be disposed in a receiving space formed by the pair of housings 210 and 220. For example, the first display 200 may be disposed in a recess 201 formed by the pair of housings 210 and 220, and may be disposed to occupy substantially the most of the front surface of the electronic device 200 in the unfolded state. According to an embodiment, the first display 230 may include a flexible display having at least one area which can be deformed into a plane or a curved surface. According to an embodiment, the first display 230 may include the first area 230a facing the first housing 210 and the second area 230b facing the second housing 220. According to an embodiment, the first display 230 may include the folding area 230c including a part of the first area 230a and a part of the second area 230b with respect to the folding axis A. According to an embodiment, at least a part of the folding area 230c may include an area corresponding to the hinge device (e.g., the hinge device 320 of FIG. 3). According to an embodiment, a division of an area of the first display 230 merely corresponds to an example physical division by the pair of housings 210 and 220 and the hinge device (e.g., the hinge device 320 of FIG. 3), and the first display 230 may be substantially displayed as one seamless full screen through the pair of the housings 210 and 220 and the hinge device (e.g., the hinge device 320 of FIG. 3). According to an embodiment, the first area 230a and the second area 230b may have shapes that are entirely symmetric or partially asymmetric to each other with respect to the folding area 230c.

According to various embodiments, the electronic device 200 may include a first rear cover 240 disposed on the second surface 212 of the first housing 210 and a second rear cover 250 disposed on the fourth surface 222 of the second housing 220. In an embodiment, at least a part of the first rear cover 240 may be integrally formed with the first side member 213. In an embodiment, at least a part of the second rear cover 250 may be integrally formed with the second side member 223. According to an embodiment, at least one of the first rear cover 240 and the second rear cover 250 may be substantially formed of a transparent plate (e.g., a polymer plate or glass plate including various coding layers) or an opaque plate. According to an embodiment, the first rear cover 240 may be formed of, for example, an opaque plate such as coded or colored glass, ceramic, polymer, metal (e.g., aluminum, stainless steel (STS), or magnesium), or a combination of at least two of the materials above. According to an embodiment, the second rear cover 250 may be substantially formed of, for example, a transparent plate such as glass or polymer. Accordingly, the second display 300 may be disposed to be seen from the outside through the second rear cover 250 in a space in the second housing 220.

According to various embodiments, the input device 215 may include a microphone. In an embodiment, the input device 215 may include multiple microphones arranged to detect the direction of sound. According to an embodiment, the sound output devices 227 and 228 may include speakers. According to an embodiment, the sound output devices 227 and 228 may include a call receiver 227 disposed through the fourth surface 222 of the second housing 220 and an external speaker 228 disposed through at least a part of the second side member 223 of the second housing 220. In an embodiment, the input device 215, the sound output devices 227 and 228, and the connector 229 may be disposed in spaces of the first housing 210 and/or the second housing 220, and may be exposed to an external environment through at least one hole formed through the first housing 210 and/or the second housing 220. In an embodiment, holes formed through the first housing 210 and/or the second housing 220 may be commonly used for the input device 215 and the sound output devices 227 and 228. In an embodiment, the sound output devices 227 and 228 may include a speaker (e.g., a piezo speaker) operating without including a hole formed through the first housing 210 and/or the second housing 220.

According to various embodiments, the camera modules 216a, 216b, and 225 may include a first camera module 216a disposed on the first surface 211 of the first housing 210, a second camera module 216b disposed on the second surface 212 of the first housing 210, and/or a third camera module 225 disposed on the fourth surface 222 of the second housing 220. According to an embodiment, the electronic device 200 may include a flash 218 disposed around the second camera module 216b. According to an embodiment, the flash 218 may include, for example, a light-emitting diode or a xenon lamp. According to an embodiment, the camera modules 216a, 216b, and 225 may include one or multiple lenses, an image sensor, and/or an image signal processor. In an embodiment, at least one of the camera modules 216a, 216b, and 225 may include two or more lenses (e.g., wide-angle and telephoto lenses) and image sensors, and may be arranged together on one surface of the first housing 210 and/or the second housing 220.

According to various embodiments, the sensor modules 217a, 217b, and 226 may generate a data value or an electrical signal corresponding to an internal operational state or an external environmental state of the electronic device 200. According to an embodiment, the sensor modules 217a, 217b, and 226 may include a first sensor module 217a disposed on the first surface 211 of the first housing 210, a second sensor module 217b disposed on the second surface 212 of the first housing 210, and/or a third sensor module 226 disposed on the fourth surface 222 of the second housing 220. In an embodiment, the sensor modules 217a, 217b, and 226 may include at least one of a gesture sensor, a grip sensor, a color sensor, an infrared (IR) sensor, an illuminance sensor, an ultrasonic sensor, an iris recognition sensor, or a distance detection sensor (e.g., a time of flight (TOF) sensor or a light detection and ranging (LiDAR)).

According to various embodiments, the electronic device 200 may further include an unillustrated sensor module, for example, at least one of an atmospheric sensor, a magnetic sensor, a biometric sensor, a temperature sensor, a humidity sensor, or a fingerprint recognition sensor. In an embodiment, the fingerprint recognition sensor may be disposed through at least one of the first side member 213 of the first housing 210 and/or the second side member 223 of the second housing 220.

According to various embodiments, the key input device 219 may be disposed to be exposed to the outside through the first side member 213 of the first housing 210. In an embodiment, the key input device 219 may be disposed to be exposed to the outside through the second side member 223 of the second housing 220. In an embodiment, the electronic device 200 may not include some or all of the key input device 219, and the unincluded key input device 219 may be implemented in another shape such as a soft key on the least one display 230 and 300. In an embodiment, the key input device 219 may be implemented using a pressure sensor included in the at least one display 230 and 300.

According to various embodiments, the connector port 229 may include a connector (e.g., a USB connector or an IF module (an interface connector port module)) for transmitting or receiving data and/or power to and/or from an external electronic device. In an embodiment, the connector port 229 may perform a function of transmitting or receiving an audio signal to or from the external electronic device together, or may further include a separate connector port (e.g., an ear jack hole) for performing a function of transmitting or receiving an audio signal to or from the external electronic device.

According to various embodiments, at least one camera modules 216a and 225 of the camera modules 216a, 216b, and 225, at least one sensor module 217a and 226 of the sensor modules 217a, 217b, and 226, and/or an indicator may be arranged to be exposed through the at least one display 230 and 300. For example, the at least one camera modules 216a and 225, the at least one sensor module 217a and 226, and/or the indicator may be arranged under an activated area (a display area) of the at least one display 230 and 300 in a space in the at least one housing 210 and 220, and may be arranged to come into contact with an external environment through a transparent area or an opening that is perforated to a cover member (e.g., a window layer (not shown) of the first display 230 and/or the second rear cover 250). According to an embodiment, an area in which the at least one display 230 and 300 and the at least one camera module 216a and 225 face each other may be formed as a transmission area having a predetermined transmission ratio, as a part of an area in which a content is displayed. According to an embodiment, the transmission area may be formed to have a transmission ratio in the range of about 5% to about 20%. The transmission area may include an area overlapping with an effective area (e.g., an angle of view area) of the at least one camera module 216a and 225, wherein an image is formed on the image sensor in the effective area, and light for generating an image passes through the effective area. For example, the transmission area of the display 230 and 300 may include an area in which the density of a pixel is lower than that in a surrounding area. For example, the transmission area may be replaced with an opening. For example, the at least one camera module 216a and 225 may include an under-display camera (UDC) or an under-panel camera (UPC). In an embodiment, some camera modules or sensor modules 271a and 226 may be arranged to perform functions thereof without being visually exposed through the display. For example, an area facing the sensor module 217a and 226 and/or the camera module 216a and 225 arranged under the display 230 and 300 (e.g., a display panel) corresponds to an under-display camera (UDC) structure, and a perforated opening is not necessarily required.

FIG. 3 is an exploded perspective view illustrating an electronic device 200 according to various embodiments.

Referring to FIG. 3, the electronic device 200 may include a first display 230 (e.g., a flexible display), a second display 300, a hinge device 320, a pair of support members 261 and 262, at least one substrate 270 (e.g., a printed circuit board (PCB)), a first housing 210, a second housing 220, a first rear cover 240, and/or a second rear cover 250.

According to various embodiments, the first display 230 may include a display panel 430 (e.g., a flexible display panel), a support plate 450 disposed under the display panel 430, and a pair of reinforced plates 461 and 462 arranged under the support plate 450. According to an embodiment, the display panel 430 may include a first panel area 430a corresponding to a first area (e.g., the first area 230a of FIG. 1A) of the first display 230, a second panel area 430b extending from the first panel area 430a and corresponding to a second area (e.g., the second area 230b of FIG. 1A) of the first display 230, and a third panel area 430c for connecting the first panel area 430a and the second panel area 430b and corresponding to a folding area (e.g., the folding area 230c of FIG. 1A) of the first display 230. According to an embodiment, the support plate 450 may be disposed between the display panel 430 and the pair of support members 261 and 262 and may be formed to have a material and a shape for providing a planar support structure for the first panel area 430a and the second panel area 430b and a bendable structure for assisting in the flexibility of the third panel area 430c. According to an embodiment, the support plate 450 may be formed of a conductive material (e.g., metal) or a non-conductive material (e.g., polymer or fiber reinforced plastic (FRP)). According to an embodiment, the pair of reinforced plates 461 and 462 may include, between the support plate 450 and the pair of support members 261 and 262, a first reinforced plate 461 disposed to correspond to at least a part of the first panel 430a and the third panel area 430c, and a second reinforced plate 462 disposed to correspond to at least a part of the second panel area 460b and the third panel area 430c. According to an embodiment, the pair of reinforced plates 461 and 462 may be formed of metal materials (e.g., SUS), and may thus assist in reinforcing of the rigidity and a ground connection structure for the first display 230.

According to various embodiments, the second display 300 may be disposed in a space between the second housing 220 and the second rear cover 250. According to an embodiment, the second display 300 may be disposed in a space between the second housing 220 and the second rear cover 250 so as to allow the second display 300 to be seen from the outside through substantially the entire area of the second rear cover 250.

According to various embodiments, at least a part of the first support member 261 may be bendably coupled to the second support member 262 through the hinge device 320. According to an embodiment, the electronic device 200 may include at least one wire member 263 (e.g., a flexible printed circuit board (FPCB)) disposed from at least a part of the first support member 261 to a part of the second support member 262 by crossing the hinge device 320. According to an embodiment, the first support member 261 may be disposed by extending from the first side member 213 or structurally coupled to the first side member 213. According to an embodiment, the electronic device 200 may include a first space (e.g., a first space 2101 of FIG. 1A) provided through the first support member 261 and the first rear cover 240. According to an embodiment, the first housing 210 (e.g., a first housing structure) may be configured by coupling of the first side member 213, the first support member 261, and the first rear cover 240. According to an embodiment, the second support member 262 may be disposed by extending from the second side member 223 or structurally coupled to the second side member 223. According to an embodiment, the electronic device 200 may include a second space (e.g., a second space 2201 of FIG. 1A) provided through the second support member 262 and the second rear cover 250. According to an embodiment, the second housing 220 (e.g., a second housing structure) may be configured through coupling of the second side member 223, the second support member 262, and the second rear cover 250. According to an embodiment, at least a part of the hinge device 320 and/or the at least one wire member 263 may be disposed to be supported through at least a part of the pair of support members 261 and 262. According to an embodiment, the at least one wire member 263 may be disposed in a direction (e.g., an x-axis direction) crossing the first support member 261 and the second support member 262. According to an embodiment, the at least one wire member 263 may be disposed in a direction (e.g., an x-axis direction) substantially perpendicular to a folding axis (e.g., a y-axis or the folding axis A of FIG. 1A).

According to various embodiments, the at least one substrate 270 may include a first substrate 271 disposed in the first space 2101 and a second substrate 272 disposed in the second space 2201. According to an embodiment, the first substrate 271 and the second substrate 272 may include multiple electronic components arranged to implement various functions of the electronic device 200. According to an embodiment, the first substrate 271 and the second substrate 272 may be electrically connected to each other through the at least one wire member 263.

According to various embodiments, the electronic device 200 may include at least one battery 291 and 292. According to an embodiment, the at least one battery 291 and 292 may include a first battery 291 disposed in the first space 2101 of the first housing 210 and electrically connected to the first substrate 271, and a second battery disposed in the second space 2201 of the second housing 220 and electrically connected to the second substrate 272. According to an embodiment, the first support member 261 and the second support member 262 may further include at least one swelling hole for the first battery 291 and the second battery 292.

According to various embodiments, the first housing 210 may include a first rotation support surface 214, and the second housing 220 may include a second rotation support surface 224 corresponding to the first rotation support surface 214. According to an embodiment, the first rotation support surface 214 and the second rotation support surface 224 may include a curved surface (seamlessly connected) corresponding to an external surface of a curved shape of the hinge housing 310. According to an embodiment, when the electronic device 200 is in the unfolded state, the first rotation support surface 214 and the second rotation support surface 224 may hide the hinge housing 310 not to expose the hinge housing 310 through the rear surface of the electronic device 200 or to expose only a part thereof. According to an embodiment, when the electronic device 200 in the folded state, the first rotation support surface 214 and the second rotation support surface 224 may be at least partially expose the hinge housing 310 through the rear surface of the electronic device 200 as the curved shape of the hinge housing 310 rotates along an external surface.

According to various embodiments, the electronic device 200 may include at least one antenna 276 disposed in the first space 2201. According to an embodiment, the at least one antenna 276 may be disposed on the first battery 291 and the first rear cover 240 in the first space 2201. According to an embodiment, the at least one antenna 276 may include, for example, a near-field communication (NFC) antenna, a wireless charging antenna, and/or a magnetic secure transmission (MST) antenna. According to an embodiment, the at least one antenna 276 may perform, for example, short-distance communication with an external device, or wirelessly transmit or receive power required for charging. In an embodiment, an antenna structure may be formed by at least a part of the first side member 213 or the second side member 223 and/or a part or a combination of the first support member 261 and the second support member 262.

According to various embodiments, the electronic device 200 may further include at least one electronic component assembly 274 and 275 and/or additional support members 263 and 273 disposed in the first space 2101 and/or the second space 2201. For example, the at least one electronic component assembly may include an interface connector port assembly 274 or the speaker assembly 275.

According to various embodiments, the electronic device 100 may include a first waterproof structure WP1 disposed between the first reinforced plate 461 and the first support member 261 and a second waterproof structure WP2 disposed between the second reinforced plate 462 and the second support member 262.

According to an embodiment, the first waterproof structure WP1 may include a first waterproof member 481 disposed to have at least one first waterproof space 4811, 4812, and 4813 formed between the first reinforced plate 461 and the first support member 261. According to an embodiment, the second waterproof structure WP2 may include a second waterproof member 482, a third waterproof member 483, and a fourth waterproof member 484 disposed to have at least one second waterproof space 4821 formed between the second reinforced plate 462 and the second support member 262. According to an embodiment, the fourth waterproof member 484 may be disposed in a space between the second waterproof member 482 and the third waterproof member 483 spaced apart from each other, to connect the second waterproof member and the third waterproof member to each other.

Figure 6:
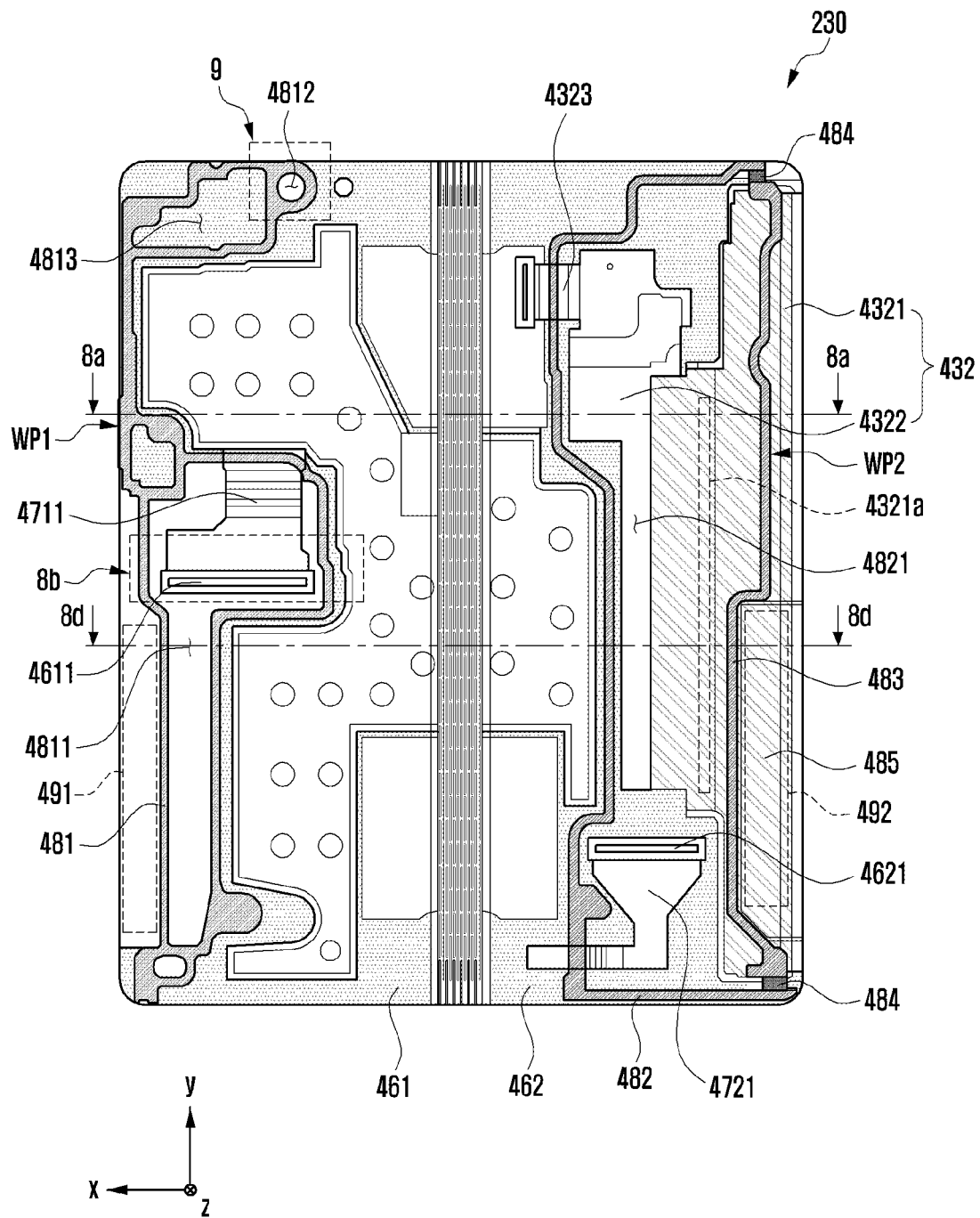
FIG. 6 is a diagram illustrating a rear surface structure of a flexible display according to various embodiments.

According to various embodiments, the at least one first waterproof space 4811 corresponds to a wire structure for connecting an electronic component (e.g., a first digitizer 471 of FIG. 4) disposed between the first reinforced plate 461 and the first support member 262 to the first space 2101 through the first waterproof member 481, and may be disposed to receive a through-path of an FPCB connection portion (e.g., a first FPCB connection portion 4711 of FIG. 6). According to an embodiment, the at least one second waterproof space 4821 corresponds to a wire structure for connecting an electronic component (e.g., a second digitizer 472 of FIG. 4) disposed between the second reinforced plate 462 and the second support member 262 to the second space 2201 through the second waterproof member 482, the third waterproof member 483, and the fourth waterproof member 484, and may be disposed to receive a through-path of an FPCB connection (e.g., a second FPCB connection 4721 of FIG. 6). According to an embodiment, the at least one first waterproof space 4812 and 4813 may receive an area corresponding to at least one electronic component (e.g., a camera module or a sensor module) disposed to be supported by the first support member 261. According to an embodiment, the at least one second waterproof space 4821 may receive at least a part of a bending portion (e.g., a bending portion 432 of FIG. 4) bent over a rear surface of the first display 230. For example, the at least one second waterproof space 4821 may be disposed to extend from a display panel (e.g., a display panel 430 of FIG. 4) of the first display 230 and surround at least a part of the bending portion 432 bent over the rear surface. Accordingly, multiple electrical elements (not shown) and a control circuit (e.g., a control circuit 4321a of FIG. 4) disposed on the bending portion 432 may be disposed in the at least one second waterproof space 4821, so as to be protected from water and/or a foreign material from the outside.

According to various embodiments, the electronic device 200 may include waterproof tape 241 disposed between the first rear cover 240 and the first housing 210. According to an embodiment, the electronic device 200 may include a bonding member 251 disposed between the second rear cover 250 and the second housing 220. In an embodiment, the bonding member 251 may be disposed between the second display 300 and the second housing 220. In an embodiment, the waterproof tape 241 may be replaced with the bonding member 251, and the bonding member 251 may be replaced with the waterproof tape 241.

In the electronic device 200 according to an example embodiment of the disclosure, the at least one waterproof member 481, 482, 483, and 484 may include at least one waterproof structure WP1 and WP2 disposed between the first support member 261 of the first housing 210 and the first reinforced plate 461 and/or between the second support member 262 of the second housing 220 and the second reinforced plate 462, so that a phenomenon in which the first display is damaged when the first display 230 is separated from the housings 210 and 220 for maintenance of the electronic device 200 can be reduced through a waterproof member, and the at least one waterproof member 481, 482, 483, and 484 is disposed to avoid the rear surface of the first display 230, and thus, external visibility can be enhanced and a surface quality can be secured.

Figure 4:
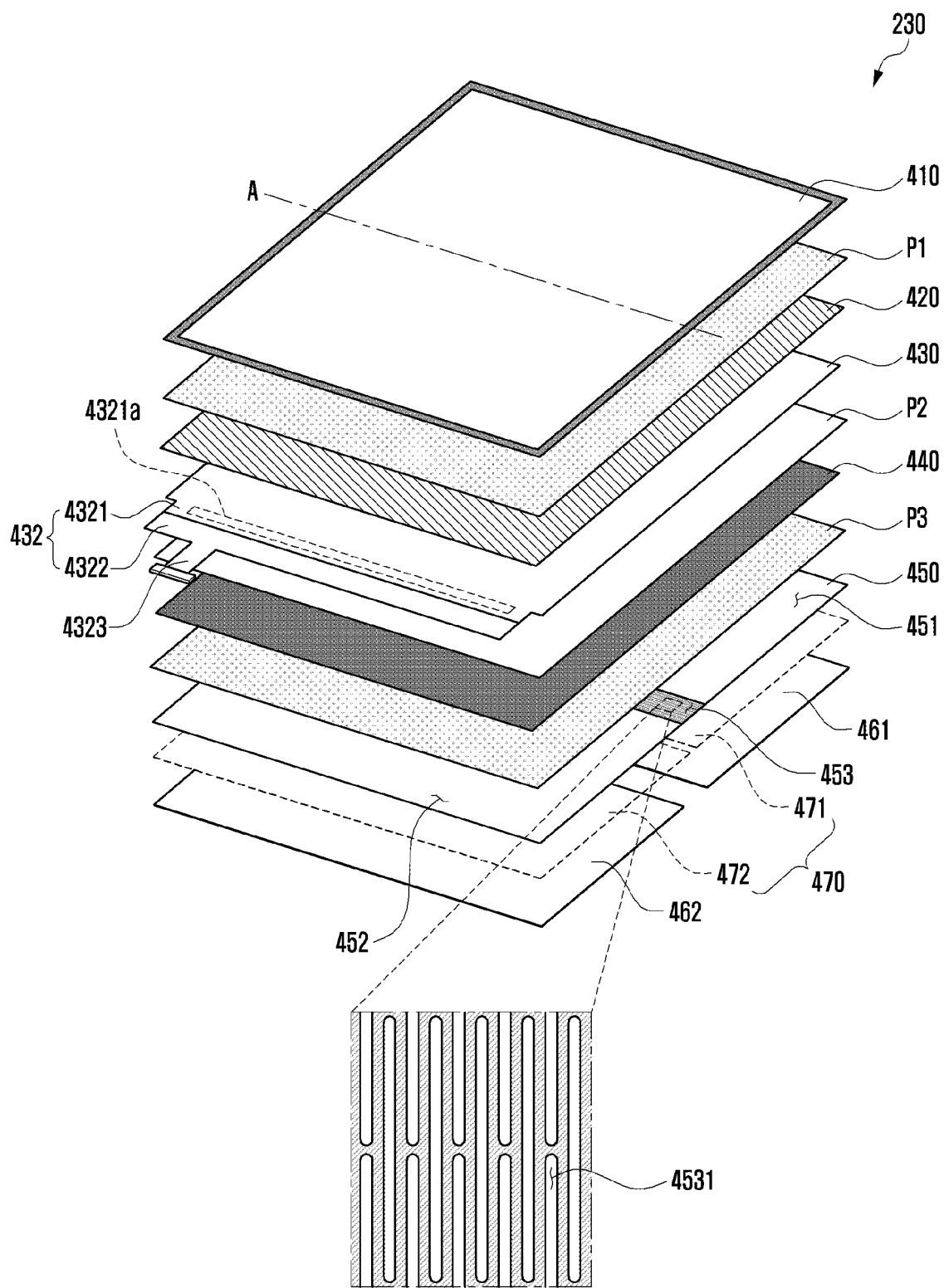
FIG. 4 is an exploded perspective view illustrating a first display according to various embodiments.

FIG. 4 is an exploded perspective view illustrating a first display according to various embodiments. Hereinafter, a first display may be referred to as a "flexible display".

A flexible display (e.g., the first display 230 of FIG. 3) according to various example embodiments of the disclosure may include an unbreakable (UB)-type OLED display (e.g., a curved display). However, the flexible display is not limited thereto and the flexible display 230 may include an oncell touch active matrix organic light-emitting diode (AMOLED) (OCTA) flat type display.

Referring to FIG. 4, the flexible display 230 may include a window layer 410, and a polarizer (POL) 420 (e.g., a polarization film), a display panel 430, a polymer layer 440, a support plate 450, and reinforced plates 461 and 462, which are sequentially arranged on a rear surface (e.g., -z axis direction) of the window layer 410. In an embodiment, the flexible display 230 may also include a digitizer 470 disposed between the support plate 450 and the reinforced plates 461 and 462. In an embodiment, the digitizer 470 may be disposed between the polymer layer 440 and the support plate 450.

According to various embodiments, the window layer 410 may include a glass layer. According to an embodiment, the window layer 410 may include an ultra-thin glass (UTG). In an embodiment, the window layer 410 may also include polymer. In this case, the window layer 410 may also include polyethylene terephthalate (PET) or polyimide (PI). In an embodiment, the window layer 410 may have multiple layers formed to include a glass layer and polymer.

According to various embodiments, the window layer 410, the polarization layer 420, the display panel 430, the polymer layer 440, and the support plate 450 may be arranged to cross at least a part of a first surface (e.g., the first surface 211 of FIG. 1A) of a first housing (e.g., the first housing 210 of FIG. 1A) and a third surface (e.g., the third surface 221 of FIG. 1A) of a second housing (e.g., the second housing 220 of FIG. 1A). According to an embodiment, the reinforced plates 461 and 462 may include a first reinforced plate 461 corresponding to the first housing (e.g., the first housing 210 of FIG. 1A) and a second reinforced plate 462 corresponding to the second housing (e.g., the second housing 220 of FIG. 1A). According to an embodiment, the reinforced plates 461 and 462 may provide rigidity for the flexible display 230, and may be used as a ground for preventing/reducing malfunction of the flexible display 230. According to an embodiment, the reinforced plates 461 and 462 may be formed of a metal material. According to an embodiment, the reinforced plates 461 and 462 may be formed of SUS or AL. According to an embodiment, the window layer 410, the polarization layer 420, the display panel 430, the polymer layer 440, the support plate 450, and the reinforced plates 461 and 462 may be attached to each other through adhesives P1, P2, or P3 (or adhesive agents). For example, the adhesives P1, P2, and P3 may include at least one of an optical clear adhesive (OCA), a pressure sensitive adhesive (PSA), a heat sensitive adhesive, a normal adhesive, or double-sided tape.

According to various embodiments, the display panel 430 may include multiple pixels and a wire structure (e.g., an electrode pattern). According to an embodiment, the polarization layer 420 may allow light generated from a light source of the display panel 430 and vibrating in a predetermined direction to selectively pass therethrough. According to an embodiment, the display panel 430 and the polarization layer 420 may be integrally formed. According to an embodiment, the flexible display 230 may also include a touch panel (not shown).

According to various embodiments, the polymer layer 440 may be disposed under the display panel 430 to provide a dark background for securing visibility of the display panel 430 and to be formed of a buffer material for buffering. In an embodiment, for waterproofing of the flexible display 230, the polymer layer 440 may be removed, or may be disposed under the support plate 450.

According to various embodiments, the support plate 450 may provide a curved characteristic to the flexible display 230. For example, the support plate 450 may be formed of a non-metal sheet type material such as fiber reinforced plastic (FRP) (e.g., carbon fiber reinforced plastic (CFRP) or glass fiber reinforced plastic (GFRP)) having a rigid characteristic to support the display panel 430. According to an embodiment, the support plate 450 may include a first plane portion 451 corresponding to the first housing (e.g., the first housing 210 of FIG. 1A), a second plane portion 452 corresponding to the second housing (e.g., the second housing 220 of FIG. 1A), and a bending portion 453 (e.g., a flexible portion or a bending portion) for connecting the first plane portion 451 and the second plane portion 452. According to an embodiment, the bending portion 453 may include multiple openings 4531 arranged to be spaced apart from each other by a designated space. According to an embodiment, a bendability characteristic of the bending portion 453 may be determined through at least one of sizes, shapes, or arrangement densities of some of the multiple openings 4531. In an embodiment, the support plate 450 may be formed of a metal material such as steel use stainless (SUS) (e.g., stainless steel (STS)), Cu, Al, or metal CLAD (e.g., a laminate member obtained by alternately arranging SUS and Al). In this case, the multiple openings may be formed through the entire area of the support plate 450 so that a detection operation of the digitizer 470 disposed under the support plate 450 is derived. According to an embodiment, the support plate 450 may assist in reinforcing rigidity of an electronic device (e.g., the electronic device 200 of FIG. 1A) and shield surrounding noise, and may be used to dissipate heat discharged from a surrounding heat discharging component.

According to various embodiments, the display 230 may be disposed under the support plate 450, and may include a digitizer 470 as a detection member for receiving an input of an electronic pen (e.g., a stylus). According to an embodiment, the digitizer 470 may include coil members arranged on a dielectric substrate (e.g., a dielectric file or a dielectric sheet) to detect an electromagnetic induction-type resonance frequency applied from the electronic pen. According to an embodiment, the digitizer 470 may include a first digitizer 471 corresponding to the first housing (e.g., the first housing 210 of FIG. 1A) and a second digitizer 472 corresponding to the second housing (e.g., the second housing 220 of FIG. 1A). According to an embodiment, the first digitizer 471 and the second digitizer 472 may be electrically connected to substrates (e.g., the substrates 271 and 272 of FIG. 3) of an electronic device (e.g., the electronic device 200 of FIG. 3) through FPCB connection portions (e.g., the first FPCB connection portion 4711 and the second FPCB connection portion 4721 of FIG. 6), respectively, so as to operate as a single digitizer. In an embodiment, the first digitizer 471 and the second digitizer 472 may individually operate.

According to various embodiments, the flexible display 230 may include at least one functional member (not shown) disposed between the polymer layer 440 and the support plate 450, or disposed under the support plate 450. According to an embodiment, the functional member may include a graphite sheet for heat dissipation, an added display, a force touch FPCB, a fingerprint sensor FPCB, a communication antenna radiator, or conductive/non-conductive tape. According to an embodiment, when the functional member is not bendable, the functional member may be individually disposed on the first housing (e.g., the first housing 210 of FIG. 1A) and the second housing (e.g., the second housing 220 of FIG. 1A). According to an embodiment, when the functional member is bendable, the functional member may be disposed from the first housing (e.g., the first housing 210 of FIG. 1A) to at least a part of the second housing (e.g., the second housing 220 of FIG. 1A) through the hinge device (e.g., the hinge device 320 of FIG. 3).

According to various embodiments, the flexible display 230 may include a bending portion 432 disposed in which the bending portion 432 is bent over at least partial area of a rear surface (e.g., −z axis direction) of the flexible display 230 from the display panel 430. According to an embodiment, the bending portion 432 may include an extension portion 4321 extending from the display panel 430 and including a control circuit 4321a, and a flexible substrate 4322 electrically connected to the extension portion 4321 and including multiple electrical elements. According to an embodiment, the control circuit 4321a may include a display driver IC (DDI) or a touch display driver IC (TDDI) mounted on the extension portion 4321 having an electrical wire structure. According to an embodiment, the bending portion 432 may include a chip on panel or chip on plastic (COP) structure in which the control circuit 4321a is directly disposed on the extension portion 4321. In an embodiment, the bending portion 432 may also include a chip on film (COF) structure in which the control circuit 4321a is mounted on a separate connection film (not shown) for connecting the extension portion 4321 and the flexible substrate 4322. According to an embodiment, the flexible display 230 may include multiple electrical elements (not shown) arranged on the flexible substrate 4322. According to an embodiment, the flexible display 230 may include an FPCB connection portion 4323 extending from the flexible substrate 4322 and electrically connected to a substrate (e.g., the second substrate 272 of FIG. 3) of an electronic device (e.g., the electronic device 200 of FIG. 3). According to an embodiment, the multiple electrical elements may include a touch IC, a display flash memory, an ESD prevention diode, a pressure sensor, a fingerprint sensor, or a passive element such as a Decap. In an embodiment, when the bending portion 432 is disposed in an area facing the first housing (e.g., the first housing 210 of FIG. 1A) of the flexible display 230, the FPCB connection portion 4323 may also be electrically connected to another substrate (e.g., the second substrate 271 of FIG. 3) of an electronic device (e.g., the electronic device 200 of FIG. 3).

According to various example embodiments of the disclosure, an electronic device (e.g., the electronic device 200 of FIG. 3) may include a wire structure of an FPCB connection portion (e.g., the FPCB connections 4711 and 4712 of FIG. 6) withdrawn from the digitizer 470 disposed on a rear surface of the flexible display 230, and a waterproof structure provided to protect, from water and/or a foreign material from the outside, areas corresponding to at least one electronic component (e.g., a camera module or a sensor module) disposed through the support members 461 and 462 and at least a part (e.g., the extension portion 4321) of the bending portion 432 bent over the rear surface of the flexible display 230 and including the control circuit 4321a and the multiple electrical elements.

Hereinafter, a detailed description of a waterproof structure provided to an electronic device is made.

Figure 5:
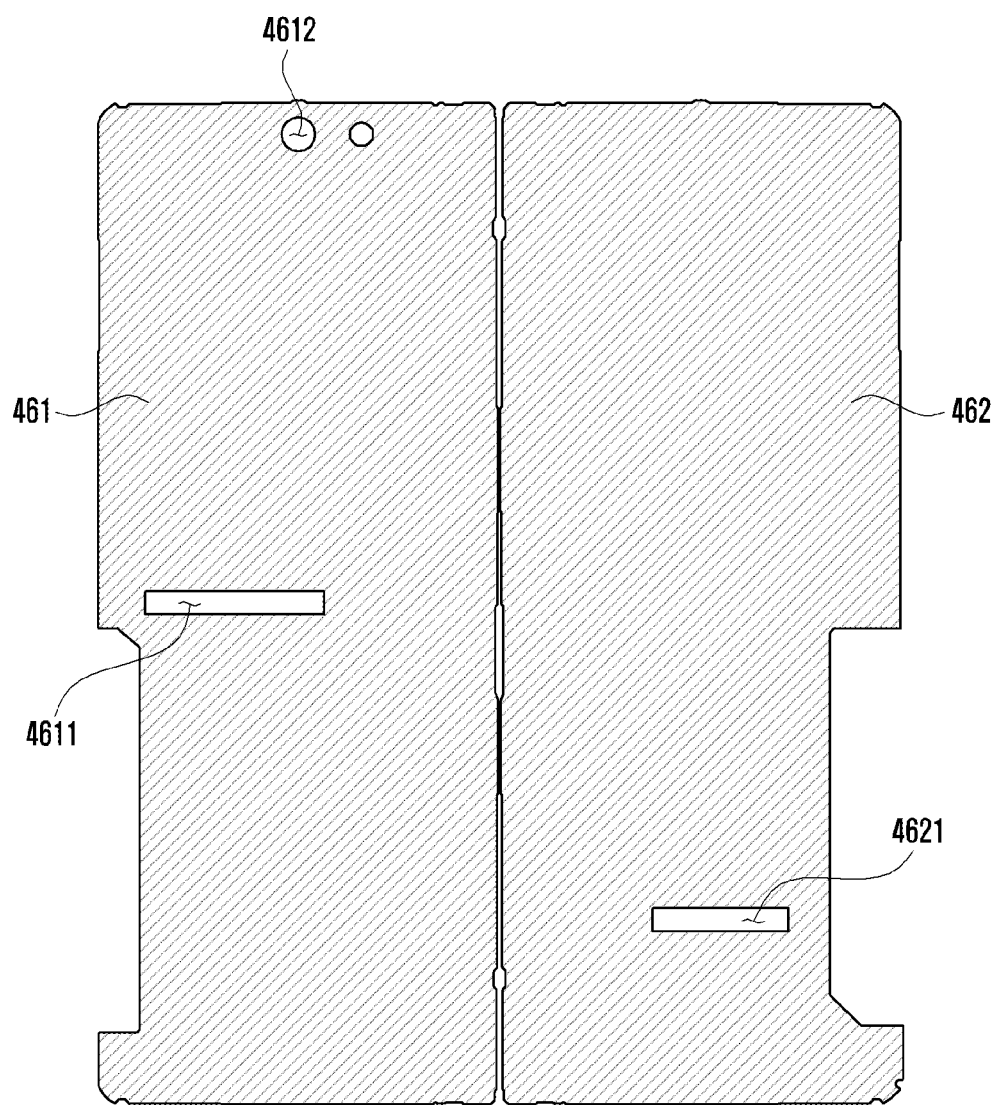
FIG. 5 is a diagram illustrating an example configuration of reinforced plates according to various embodiments.

FIG. 5 is a diagram illustrating an example configuration of reinforced plates according to various embodiments. FIG. 6 is a diagram illustrating a rear surface structure of a flexible display according to various embodiments.

FIGS. 5 and 6 illustrate configurations of a flexible display 230 and reinforced plates 461 and 462 seen when an electronic device (e.g., the electronic device 200 of FIG. 1B) is seen in a rear direction (e.g., when the electronic device is seen in the state shown in FIG. 1B).

Referring to FIGS. 5 and 6, an electronic device (e.g., the electronic device 200 of FIG. 3) may include a first reinforced plate 461 corresponding to a first housing (e.g., the first housing 210 of FIG. 1A) and a second reinforced plate 462 corresponding to a second housing (e.g., the second housing 220 of FIG. 1A). According to an embodiment, a first digitizer (e.g., the first digitizer 471 of FIG. 4) may be disposed between a support plate (e.g., the support plate 450 of FIG. 4) and the first reinforced plate 461, and a first FPCB connection portion 4711 of the first digitizer 471 may be electrically connected to a substrate (e.g., the first subplate 271 of FIG. 3) disposed in a first space (e.g., the first space 2101 of FIG. 1A) of a first housing (e.g., the first housing 210 of FIG. 1A) through the first reinforced plate 461. Accordingly, the first reinforced plate 461 may include a first through-hole 4611 through which the first FPCB connection portion 4711 is to extend. According to an embodiment, a second digitizer (e.g., the second digitizer 472 of FIG. 4) may be also disposed between the support plate (e.g., the support plate 450 of FIG. 4) and the second reinforced plate 462, and a second connection portion 4721 of the second digitizer 472 may be electrically connected to a substrate (e.g., the second substrate 272 of FIG. 3) disposed in a second space (e.g., the second space 2201 of FIG. 1A) of a second housing (e.g., the second housing 220 of FIG. 1A), through the second reinforced plate 462. Accordingly, the second reinforced plate 462 may include a second through-hole 4621 through which the second FPCB connection portion 4721 is to extend. According to an embodiment, the first reinforced plate 461 may include at least one hole 4612 for one or more electronic components (e.g., a camera module or a sensor module) arranged to be supported by a first support member (e.g., the first support member 261 of FIG. 3). For example, the at least one electronic component may be disposed to correspond to at least one hole 4612 to detect an external environment through the flexible display 230.

According to various embodiments, the electronic device (e.g., the electronic device 200 of FIG. 3) may include a first waterproof structure WP1 disposed between the first reinforced plate 461 and the first support member (e.g., the first support member 261 of FIG. 3) of the first housing (e.g., the first housing 210 of FIG. 3) and a second waterproof structure WP2 disposed between the second reinforced plate 462 and the second support member (e.g., the second support member 262 of FIG. 3) of the second housing (e.g., the second housing 220 of FIG. 3). According to an embodiment, the first waterproof structure WP1 may include at least one first waterproof space 4811, 4812, and 4813 formed through the first waterproof member 481. According to an embodiment, the first waterproof member 481 may include at least one of tape, an adhesive, waterproof dispensing, silicone, waterproof rubber, and urethane. According to an embodiment, the at least one first waterproof space 4811, 4812, and 4813 may include a closed loop-shaped waterproof space 4811, a closed loop-shaped waterproof space 4812 spaced apart from the waterproof space 4811, and a closed loop-shaped waterproof space 4813 spaced apart from the waterproof space 4812. According to an embodiment, the first through-hole 4611 may be disposed at a position at least partially overlapping with the waterproof space 4811 when seen from above the first reinforced plate 461. According to an embodiment, the at least one hole 4612 may be disposed at a position at least partially overlapping with the waterproof space 4812 when seen from above the first reinforced plate 461. The waterproof space 4813 may be disposed a position overlapping with the at least one electronic component (e.g., a sensor module).

According to various embodiments, the second waterproof structure WP2 may include a closed loop-shaped fourth waterproof space 4821 formed through a second waterproof member 482, a third waterproof member 483, and a fourth waterproof member 484. According to an embodiment, the second through-hole 4621 may be disposed at a position at least partially overlapping with the fourth waterproof space 4821 when seen from above the second reinforced plate 462. According to an embodiment, the fourth waterproof space 4821 may be formed between the second reinforced plate 462 and the second support member 262 and through the second waterproof member 482 disposed to surround at least a part of the bending portion 432, the third waterproof member 483 disposed between the extension portion 4321 and the second support member 262, and the fourth waterproof member 484 for connecting the second waterproof member 482 and the third waterproof member 483. According to an embodiment, the second waterproof member 482 and the third waterproof member 483 may include at least one of tape, an adhesive, waterproof dispensing, silicone, waterproof rubber, and urethane. According to an embodiment, when the second waterproof member 482 and the third waterproof member 483 are integrally formed, water or a foreign material may be introduced into a gap formed due to a height difference (a step) between the bending portion 432 and the second reinforced plate 462. According to an embodiment, the second waterproof member 482 may be attached in a state in which the second waterproof member 482 is separated to be spaced apart from the third waterproof member 483 by a designated space at the stepped portion, wherein the stepped portion including the corresponding space may be connected through the fourth waterproof member 484 without a gap. According to an embodiment, the fourth waterproof member 484 may include a semisolid or liquid material, and include a cured in place gasket (CIPG) (e.g., a waterproof filling member) having a characteristic of naturally solidifying or solidifying by an external condition (e.g., heat, ultraviolet rays, moisture, or pressure).

According to various embodiments, the second through-hole 4621 may be disposed at a position at least partially overlapping with the fourth waterproof space 4821 when seen from above the second reinforced plate 462. According to an embodiment, the flexible display 230 may include a third FPCB connection portion 4323 extending from a flexible substrate 4322 of the bending portion 432.

According to an embodiment, the third FPCB connection portion 4323 may be electrically connected to a substrate (e.g., the second substrate 272 of FIG. 3) disposed in a second space (e.g., the second space 2201 of FIG. 1A) through the second support member 262. According to an embodiment, an area in which the third FPCB connection portion 4323 is disposed may be also disposed in an area at least partially overlapping with the fourth space 4821 when seen from above the second reinforced plate 262. Accordingly, the second through-hold 4621 and the third FPCB connection portion 4323 may be positioned in the closed loop-shaped fourth waterproof space 4821 to prevent and/or reduce water and a foreign material from being introduced.

Figure 7:
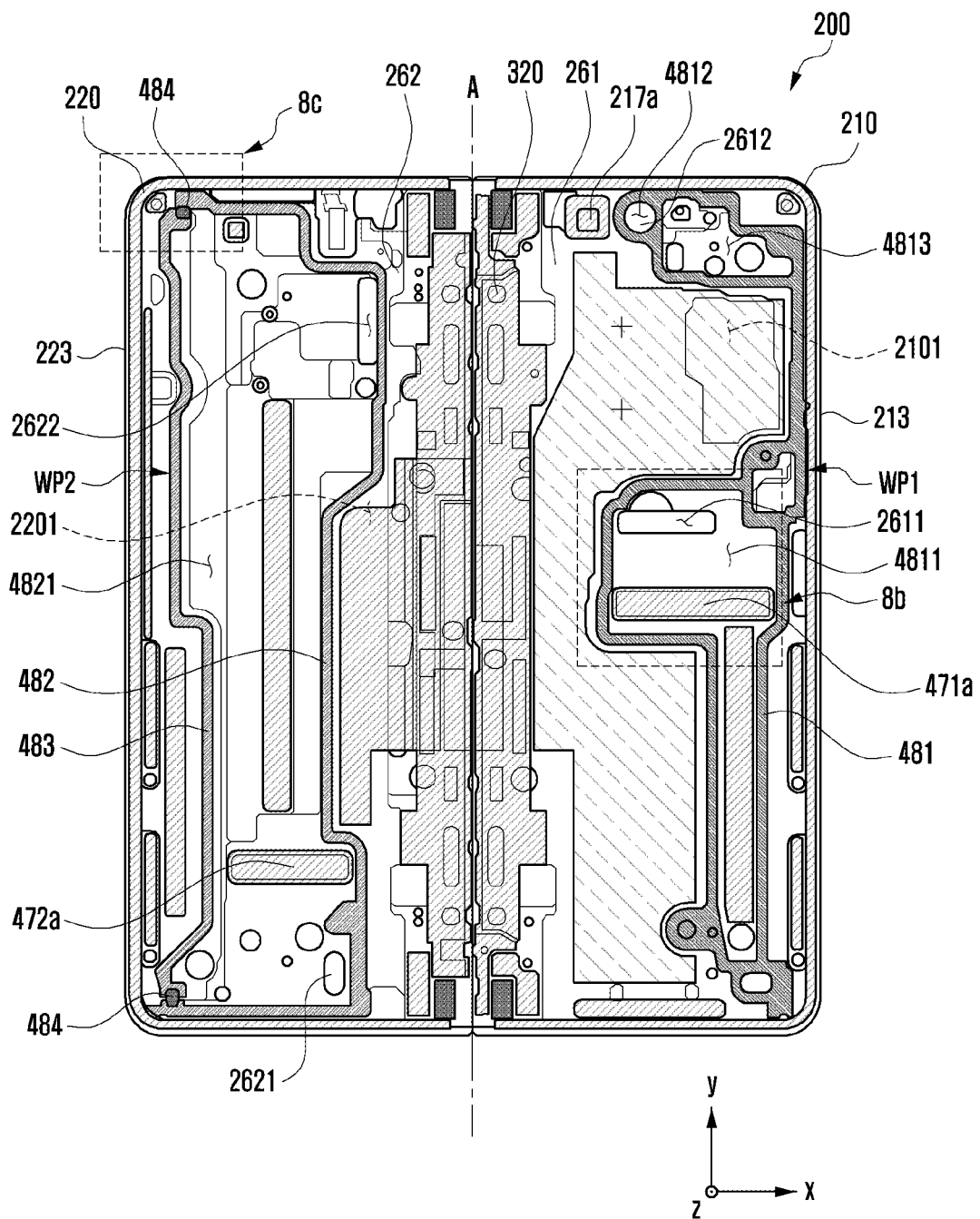
FIG. 7 is a diagram illustrating an example configuration of an electronic device, in an unfolded state while a flexible display is omitted, according to various embodiments.

FIG. 7 is a diagram illustrating an example configuration of an electronic device, which indicates an unfolded state while a flexible display is omitted, according to various embodiments.

FIG. 7 illustrates configurations of housings 210 and 220 seen when an electronic device (e.g., the electronic device 200 of FIG. 1A) is seen in a front surface direction (e.g., when the electronic device is seen in the state shown in FIG. 1A).

Referring to FIGS. 5, 6 and 7 (which may be referred to as FIGS. 5 to 7), an electronic device 200 may include a first housing 210, and a second housing 220 foldably connected to the first housing 210 through a hinge device (e.g., the hinge device 320 of FIG. 3). According to an embodiment, the first housing 210 may include a first side member 213 for forming at least a part of a side surface of the electronic device 210, and a first support member 261 extending from the first side member 213 to a first space 2101. According to an embodiment, the second housing 220 may include a second side member 223 for forming at least a part of a side surface of the electronic device, and a second support member 262 extending from the second side member 223 to a second space 2201. According to an embodiment, the first support member 261 and the second support member 262 may be substantially formed as a flat surface to support the flexible display 230 of FIG. 6. According to an embodiment, when the flexible display 230 is coupled to be supported by the first housing 210 and the second housing 220, the first reinforced plate 461 may be disposed to face at least a part of the first support member 261, and the second reinforced plate 462 may be disposed to face at least a part of the second support member 262.

According to various embodiments, the first support member 261 may include a first member through-hole 2611 connected to the first space 2201 from an external surface. According to an embodiment, when the flexible display 230 is disposed, the first FPCB connection portion 4711 of the first digitizer 471 withdrawn from the first through-hole 4611 of the first reinforced plate 461 may be electrically connected to a first substrate (e.g., the first substrate 271 of FIG. 3) disposed in the first space 2101 of the first housing 210, through the first member through-hole 2611 formed through the first support member 261. According to an embodiment, when the flexible display 230 is disposed, the second FPCB connection portion 4721 of the second digitizer 472 withdrawn from the second through-hole 4621 of the second reinforced plate 462 may be electrically connected to a second substrate (e.g., the second substrate 272 of FIG. 3) disposed in the second space 2201 of the second housing 220, through the second member through-hole 4621 formed through the second support member 262. According to an embodiment, the third FPCB connection portion 4323 disposed to be bent over a rear surface of the flexible display 230 and connected to the flexible substrate 4322 may be electrically connected to a second substrate (e.g., the second substrate 272 of FIG. 3) disposed in the second space 4821 of the second housing 220, through the third member through-hole 2622 formed through the second support member 261. According to an embodiment, at least one electronic component (e.g., a camera module or a sensor module) disposed in the first space 2101 may be disposed to be oriented in a direction of a flexible display through a module receiving hole 2612 formed through the first support member 261.

According to various embodiments, a penetration structure of the first FPCB connection portion 4711 through the first through-hole 4611 of the first reinforced plate 461 and the first member through-hole 2611 of the first support member 261 may be disposed to be included in the first waterproof space 4811 formed by the first waterproof structure WP1 when seen from above the first support member 261, so as to be protected from water and/or a foreign material from the outside. According to an embodiment, a penetration structure of the second FPCB connection portion 4721 through the second through-hole 4621 of the second reinforced plate 462 and the second member through-hole 2621 of the second support member 262 may be disposed to be included in the fourth waterproof space 4821 formed by the second waterproof structure WP2 when seen from above the second support member 262, so as to be protected from water and/or a foreign material from the outside. According to an embodiment, a penetration structure of the third FPCB connection portion 4323, extending through the third member through-hole 2622 of the second support member 262 and extending from the bending portion 432 of a display panel (e.g., the display panel 430 of FIG. 4), may be disposed to be included in the fourth waterproof space 4821 formed by the second waterproof structure WP2 when seen from above the second support member 262, so as to be protected from water from the outside. According to an embodiment, the module receive hole 2612 formed through the first support member 261 may be disposed to be included in the second waterproof space 4812 formed by the first waterproof structure WP1 when seen from above the first support member 261, so that the at least one electronic component can be protected from water from the outside.

According to various embodiments, the first digitizer 471 and the second digitizer 472 may include a shield layer (e.g., a magnetic metal powder (MMP)) disposed on a rear surface, so as to shield an electromagnetic signal. According to an embodiment, the first digitizer 471 and the second digitizer 472 may omit a shield layer in an in area in which the first FPCB connection portion 4711 and the second FPCB connection portion 4721 are withdrawn. Accordingly, when seen from above the first reinforced plate 461, the first support member 261 may include a first shield layer 471a (e.g., a shield member or an MMP) disposed at a position corresponding to the first through-hole 4611. Accordingly, the first member through-hole 2611 may be disposed at a position not overlapping with the first through-hole 4611. According to an embodiment, when seen from above the second reinforced plate 462, the second support member 262 may include a second shield layer 472a (e.g., a shield member or an MMP) disposed at a position corresponding to the second through-hole 4621. Accordingly, the second member through-hole 2621 may be disposed at a position not overlapping with the second through-hole 4621.

Figure 8A:
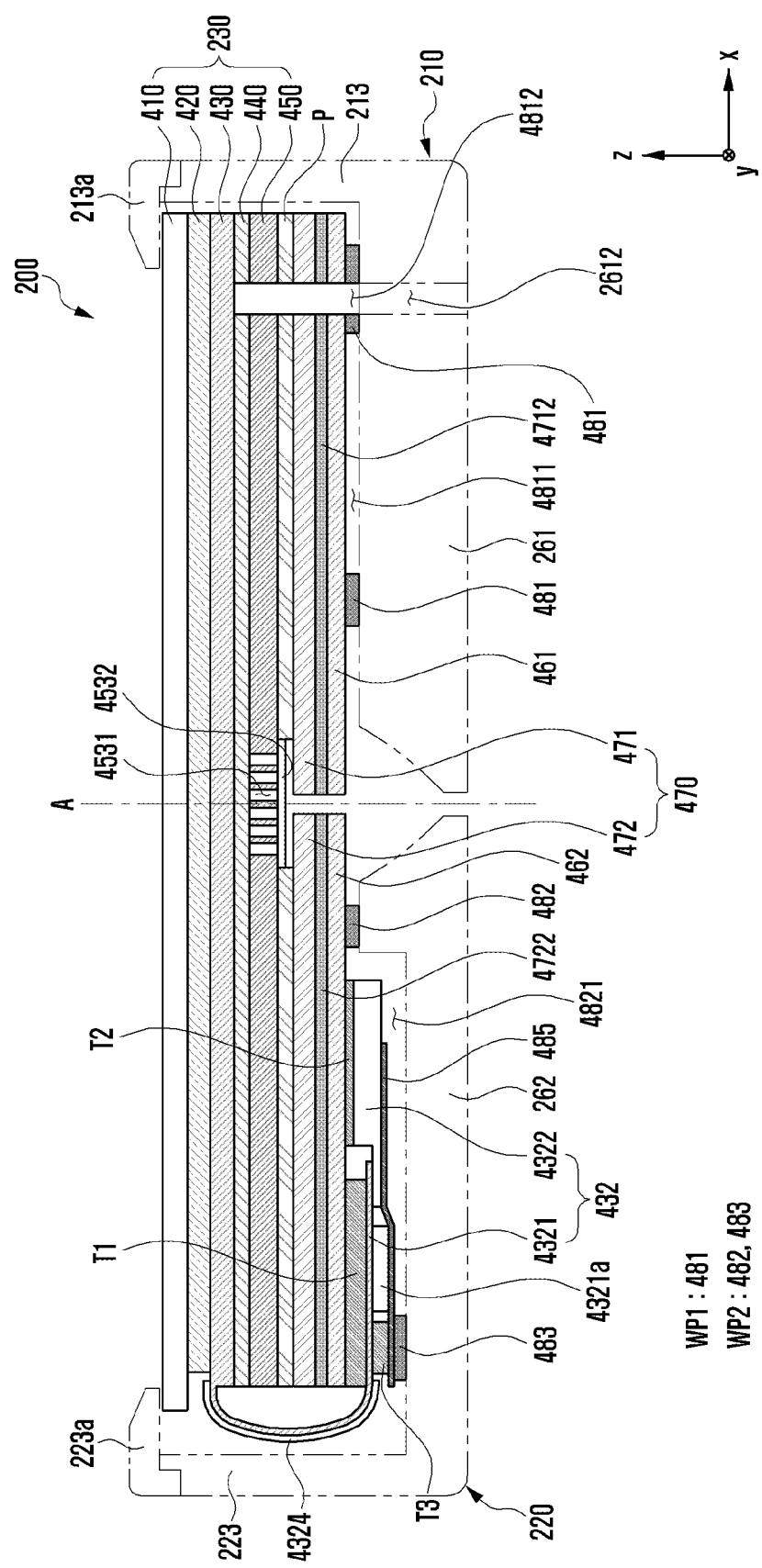
FIG. 8A is a cross-sectional view illustrating an electronic device including a flexible display, taken along line 8a-8a in FIG. 6 according to various embodiments.

FIG. 8A is a cross-sectional view illustrating an electronic device including a flexible display, taken along line 8a-8a in FIG. 6 according to various embodiments.

Referring to FIG. 8A, an electronic device 100 may include a first housing 210 including a first side member 213, a second housing including a second side member 223, and a flexible display 230 disposed to be supported by the first housing 210 and the second housing 220. According to an embodiment, the flexible display 230 may be disposed to be supported by a first support member 261 extending from the first side member 213 and a second support member 262 extending from the second side member 223. According to an embodiment, the first housing 210 may include a first protection frame 213a (e.g., a first decoration member) which is, when seen from above the flexible display 230, coupled to the first side member 213 and disposed to overlap with an edge of the flexible display 230, so as to cover the edge of the flexible display 230 to allow the same not to be seen from the outside. According to an embodiment, the first protection frame 213a may be also integrally formed with the first side member 213. According to an embodiment, the second housing 220 may include a second protection frame 223a (e.g., a second decoration member) which is, when seen from above the flexible display 230, coupled to the second side member 223 and disposed to overlap with an edge of the flexible display 230, so as to cover the edge of the flexible display 230 to allow the same not to be seen from the outside. According to an embodiment, the second protection frame 223a may be also integrally formed with the first side member 223. In an embodiment, the first protection frame 213a and the second protection frame 223a may be omitted. In an embodiment, in order to receive a slip phenomenon occurring upon an operation of folding or unfolding the electronic device 200, the flexible display 230 may be disposed to maintain a gap of a designated interval between the side members 213 and 223 and the protection frames 213a and 223a, respectively.

According to various embodiments, the flexible display 230 may include a window layer 410, and a polarization layer 420, a display panel 430, a polymer layer 440, a support plate 450, a pair of digitizers 471 and 472, and a pair of reinforced plates 461 and 462, which are sequentially arranged under the window layer 410. According to an embodiment, the support plate 450 may include multiple openings 4531 formed in a folding area to provide bendability to the flexible display 230. According to an embodiment, the flexible display 230 may further include a shield member 4532 disposed in the middle of an adhesive layer P for attaching the digitizer 470 to the support plate 450, to shield the multiple openings 4531. According to an embodiment, the shield member may include thermoplastic polyurethane (TPU) attached to the support plate. According to an embodiment, the pair of digitizers 471 and 472 may include a first digitizer 471 disposed at a position corresponding to the first housing 210, and a second digitizer 472 disposed at a position corresponding to the second housing 220. According to an embodiment, the pair of reinforced plates 461 and 462 may include a first reinforced plate 461 disposed at a position corresponding to the first housing 210, and a second reinforced plate 462 disposed at a position corresponding to the second housing 220. According to an embodiment, the electronic device 200 may include a first metal sheet layer 4712 disposed between the first digitizer 471 and the first reinforced plate 461, and a second metal sheet layer 4722 disposed between the second digitizer 472 and the second reinforced plate 262. According to an embodiment, the first metal sheet layer 4712 and the second metal sheet layer 4722 may assign directivity to an electromagnetic induction signal generated from the digitizers 471 and 472, and may be formed of a metal material capable of preventing/reducing an eddy current. According to an embodiment, each of the first metal sheet layer 4712 and the second metal sheet layer 4722 may include a Cu sheet.

According to various embodiments, the flexible display 230 may include a bending portion 432 extending toward an outer side from the display panel 430 and disposed to be bent over a rear surface (e.g., a surface of the second reinforced plate 462) of the flexible display 230. According to an embodiment, the flexible display 230 may further include a bending portion protection layer 4324 (e.g., a bending protection layer (BPL)) which is laminated on an outer surface of the bending portion 432 and is for protecting at least a part of the bending portion 432. According to an embodiment, the bending portion 432 may include an extension portion 4321 extending from the display panel 430 and including a control circuit 4321a, and a flexible substrate 4322 connected to the extension portion 4321 and including multiple electrical elements. According to an embodiment, the bending portion 432 may be bent over the rear surface of the flexible display 230 and attached to the second reinforced plate 462. According to an embodiment, a ground of the flexible substrate 4322 may be electrically connected to the second reinforced plate 462 to assist in preventing/reducing malfunction (e.g., a flicker phenomenon) of the flexible display 230. According to an embodiment, the extension portion 4321 of the bending portion 432 may be attached to the second reinforced plate 462 on the rear surface of the flexible display 230 through a first adhesive member T1. According to an embodiment, the flexible substrate 4322 may be attached to the second reinforced plate 462 through the second adhesive member T2. For example, the first adhesive member T1 corresponds to a tape member having a designated thickness and may also perform a role of a spacer having a thickness for compensating a height difference between the extension portion 4321 and the flexible substrate 4322 and maintain a bent state of the bending portion 432. According to an embodiment, the first adhesive member T1 and/or the second adhesive member T2 may be at least partially exposed to the outside and may thus include a waterproof member (e.g., waterproof tape). According to an embodiment, the first adhesive member T1 may include PET, PI, or a material obtained by combining closed-type foam and PET. According to an embodiment, the second adhesive member T2 may include conductive tape for electrically connecting the ground of the flexible substrate 4322 to the second reinforced plate 462. In an embodiment, the second adhesive member T2 may also have a compensation function for compensating a height difference between the extension portion 4321 and the flexible substrate 4322.

According to various embodiments, the control circuit 4321a disposed on the extension portion 4321 may be protected by a cover member 485 attached to cover at least a part of the flexible substrate 4322 to at least a part of the extension portion 4321. According to an embodiment, the control circuit 4321a may be disposed between the flexible substrate 4322 and the third adhesive member T3 disposed between the cover member 485 and the extension portion 4321, so as to be sealed. In an embodiment, when the size of the control circuit 4321a is small and the distance between the control circuit 4321a and the bending portion protection layer 4324 is far, the third adhesive member T3 may be omitted. In this case, a part of the cover member 485 may be bent and then directly attached to the extension portion 4321. According to an embodiment, the third adhesive member T3 may include a waterproof member (e.g., waterproof tape). According to an embodiment, the third adhesive member T3 may be disposed between the bending portion protection layer 4324 and the control circuit 4321a. According to an embodiment, at least a part of the cover member 485 may directly come into contact with water and/or a foreign material from the outside and may be thus formed of a material, wherein the material itself has a waterproof structure. For example, the cover member 485 may include a conductive non-woven fabric which has pieces of conductive fiber tissue, which are irregularly arranged, and prevents and/or reduces water from being introduced from the outside.

According to various embodiments, the electronic device 200 may include a first waterproof structure WP1 including a first waterproof member 481 disposed between the first reinforced plate 461 and the first support member 261. According to an embodiment, the first waterproof member 481 may provide a first waterproof space 4811, a second waterproof space 4812, and a third waterproof space (e.g., the third waterproof space 4813 of FIG. 7) between the first reinforced plate 461 and the first support member 261. According to an embodiment, the first waterproof space 4811 may receive a through-path for a first FPCB connection portion (e.g., the first FPCB connection portion 4711 of FIG. 6) of the first digitizer 471. According to an embodiment, the second waterproof space 4812 may receive a module receiving hole 2612 formed through the first support member 261, so as to connect a camera module (e.g., the camera module 261a of FIG. 1A) disposed in a first space (e.g., the first space 2101 of FIG. 7) of the first housing 210 to the display panel 430. According to an embodiment, the third waterproof space (e.g., the third waterproof space 4813 of FIG. 7) may receive at least one electronic component (e.g., a sensor module) disposed through the first housing 210. According to an embodiment, the first reinforced plate 461 extending to a position that is substantially the same as or similar to that of the edge of the first support member 261, so as to include a hole (e.g., a camera hole) corresponding to the module receiving hole 2612.

According to various embodiments, the electronic device 200 may include a second waterproof structure WP2 including a second waterproof member 482, a third waterproof member 483, and a fourth waterproof member (e.g., the fourth waterproof member 484 of FIG. 7) arranged between the second reinforced plate 462 and the second support member 262. According to an embodiment, the second waterproof structure WP2 may provide a fourth waterproof space 4821 between the second waterproof plate 462 and the second support member 262. According to an embodiment, the second waterproof member 482 may be disposed on the second reinforced plate 462 to surround at least a part of the bending portion 432, the third waterproof member 483 may be disposed on the cover member 485, and the fourth waterproof member 484 may be disposed in a stepped space between the second waterproof member 482 and the third waterproof member 483 spaced apart from each other, to connect the second waterproof member and the third waterproof member. According to an embodiment, the fourth waterproof space 4821 may receive a through-path for a second FPCB connection portion (e.g., the second FPCB connection portion 4721 of FIG. 6) of the second digitizer 472. According to an embodiment, the fourth waterproof space 4821 may include a through-path for a third FPCB connection portion (e.g., the third FPCB connection portion 4323 of FIG. 6) extending from the flexible substrate 4322. Accordingly, the control circuit 4321a and the multiple electrical elements may be formed between the second reinforced plate 462 and the second support member 262 through the second waterproof member 482, the third waterproof member 483, and the fourth waterproof member 484, may be disposed in the fourth waterproof space 4821 having a closed-loop shape, which has overcome a discontinuous interval caused by a stepped structure, and thus can be protected from water and/or a foreign material introduced from the outside.

The waterproof structures WP1 and WP2 according to various example embodiments of the disclosure may have an arrangement structure in which the multiple waterproof members 481, 482, 483, and 484 are attached to the reinforced plates 461 and 462 rather than on the rear surface of the display panel 430, and thus, a damage (e.g., tearing due to an adhesive force) of the display panel 430 during the maintenance of the electronic device 200 can be reduced and visibility can be enhanced. In addition, the multiple waterproof members 481, 482, 483, and 484 are not directly attached to the digitizers 471 and 472, and thus, deterioration in a waterproof function by a coil pattern can be reduced. In addition, the digitizers 471 and 472 and/or an electrical connection (e.g., through-paths of the FPCB connection portions 4711, 4721, and 4723) of the display panel 430 may be provided in the waterproof spaces 4811 and 4821, and thus, exposure to water from the outside and/or contamination due to a foreign material can be reduced.

FIG. 8B is a cross-sectional view of a part of an electronic device, which illustrates a state in which an FPCB connection portion is disposed through area 8b in FIG. 6 and area 8b in FIG. 7, according to various embodiments.

Referring to FIG. 8B, an electronic device (e.g., the electronic device 300 of FIG. 3) may include a first waterproof member 481 disposed between a first support member 261 of a first housing 210 and a first reinforced plate 461 disposed under a first digitizer 471. According to an embodiment, the first waterproof member 481 may include a first waterproof space 4811 formed between the first support member 261 and the first reinforced plate 461. According to an embodiment, the first digitizer 471 may include a through-hole 4711a formed on a first metal sheet layer 4712 disposed between the first digitizer 471 and the first reinforced plate 461, and a first FPCB connection portion 4711 formed on the first reinforced plate 461 and withdrawn through a first through-hole 4611 received in the first waterproof space 4811. According to an embodiment, one end of the first FPCB connection portion 4711 may be electrically connected to the first digitizer 471 through a solder S, and the other end may extend through a first member through-hole 2611 formed through the first support member 261, and then electrically connected to a first substrate 271 disposed in a first space (e.g., the first space 2101 of FIG. 1A) of the first housing 210. In an embodiment, at least a part of the first FPCB connection portion 4711 may be attached to a surface of the reinforced plate 461 through a fourth adhesive member T4 in the first waterproof space 4811. Accordingly, a cable through-path for connecting the first digitizer 471 and the first substrate 271 may be disposed in the first waterproof space 4811 formed through the first waterproof member 481, and can thus prevent and/or reduce water and/or a foreign material from being introduced from the outside. Although not shown, a second digitizer (e.g., the second digitizer 472 of FIG. 8) may also electrically connected to a second substrate (e.g., the second substrate 272 of FIG. 3) disposed in a second space (e.g., the second space 2201 of FIG. 1A) of a second housing (e.g., the second housing 220 of FIG. 1A) in substantially the same scheme as the first digitizer, through a fourth waterproof space (e.g., the fourth waterproof space 4821 of FIG. 8A) formed through a second waterproof structure (e.g., the second waterproof structure WP2 of FIG. 8A).

Figure 8C:
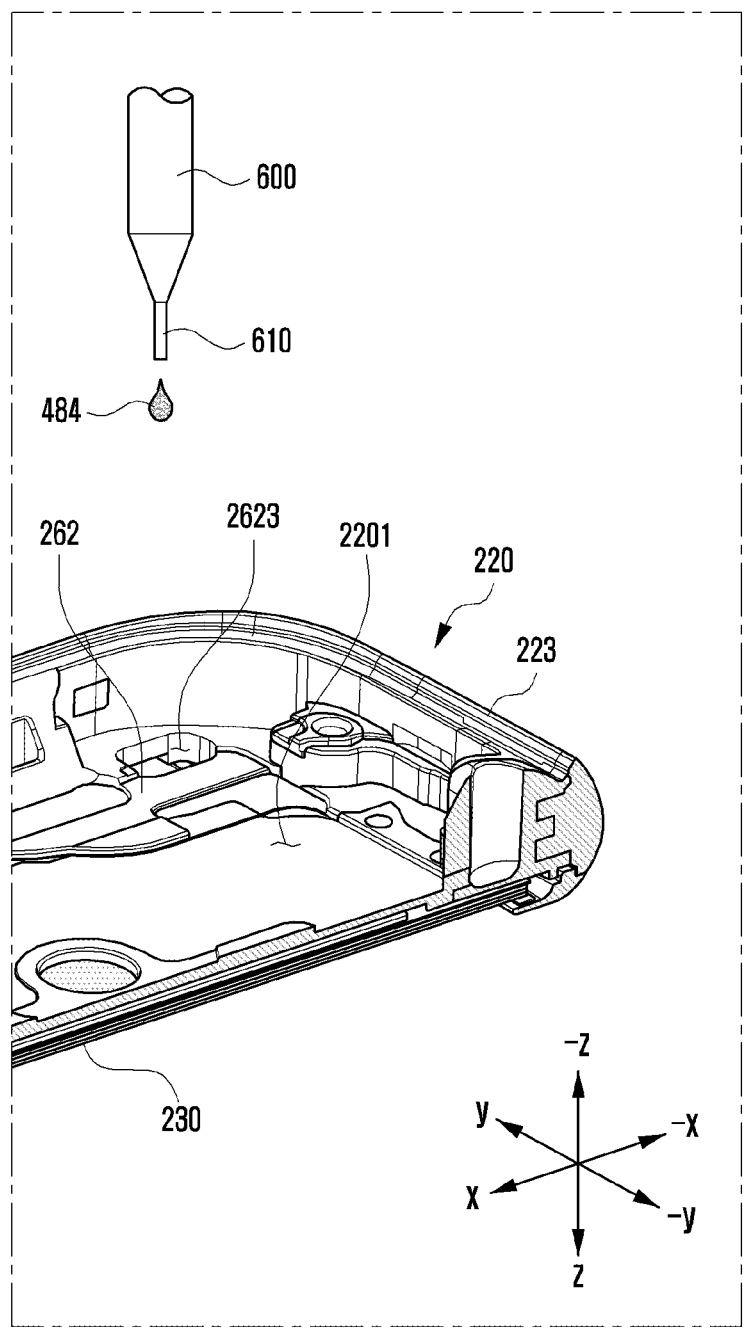
FIG. 8C is a perspective view of a part of a second housing, illustrating a state in which a fourth waterproof member is applied in area 8c in FIG. 7, according to various embodiments.

FIG. 8C is a perspective view of a part of a second housing, illustrating a state in which in which a fourth waterproof member is applied in the 8c area in FIG. 7, according to various embodiments.

Referring to FIG. 8C, a second housing 220 may include a filling member injection hole 2623 (e.g., a through-hole) formed through the second support member 262 in a position facing a second reinforced plate (e.g., the second reinforced plate 462 of FIG. 6) and corresponding to a space between a second waterproof member (e.g., the second waterproof member 482 of FIG. 7) and a third waterproof member (e.g., the third waterproof member 483 of FIG. 7) spaced apart from each other. For example, a filling member injection hole 2623 may be formed at a position corresponding to a space between a second waterproof member 482 attached to the second reinforced plate 462 and a third waterproof member (e.g., the third waterproof member 484 of FIG. 7) attached to a cover member (e.g., the cover member 485 of FIG. 8A), the second waterproof member and the third waterproof member being spaced apart from each other. According to an embodiment, the fourth waterproof member 484 may be injected through the filling member injection hole 2623 from a second space 2201 of the second housing 220 in a state in which the second water member 482 and the third waterproof member 483 are attached (e.g., when the flexible display 230 is attached to the second housing 220). According to an embodiment, after a needle 610 of a dispenser 600 is partially inserted into the filling member injection hole 263, the fourth waterproof member 484 may be applied in a liquid or a semisolid form though the needle 610, and then solidifies. In this case, the solidifying fourth waterproof member 484 may connect the second waterproof member 482 and the third waterproof member 483, becomes rigid, and then is fixed in the second support member 262 and the space between the second waterproof member 482 and the third waterproof member 483 spaced apart from each other, and can thus assist in forming a sealed fourth waterproof space (e.g., the fourth waterproof space 4821 of FIG. 7).

Figure 8D:
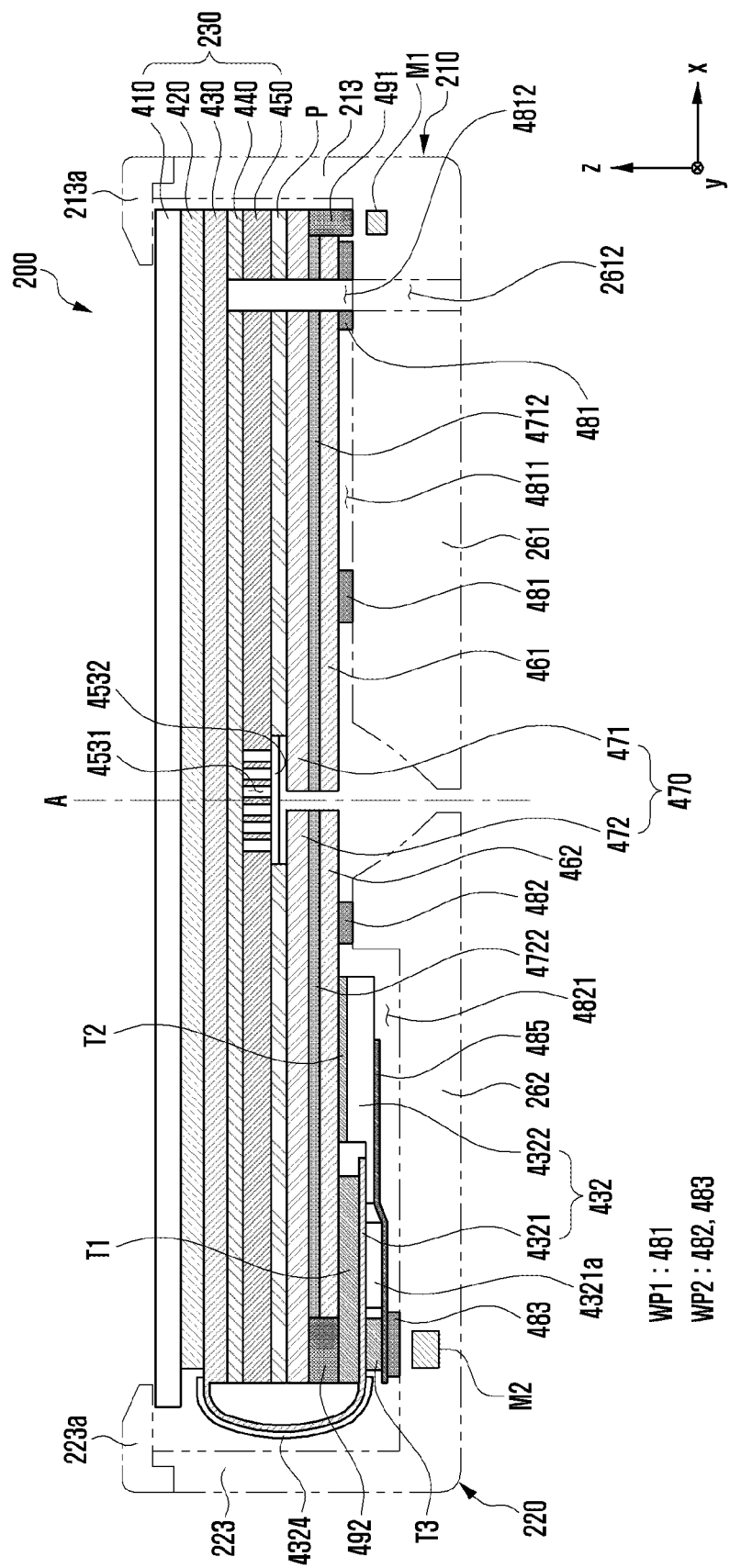
FIG. 8D is a cross-sectional view illustrating an electronic device including a flexible display, taken along the line 8d-8d in FIG. 6, according to various embodiments.

FIG. 8D is a cross-sectional view illustrating an electronic device including a flexible display, taken along the line 8d-8d in FIG. 6, according to various embodiments.

In describing an electronic device 200 of FIG. 8D, the same reference numerals are assigned to elements that are substantially the same as or similar to those of the electronic device 200 of FIG. 8A, and a detailed description thereof may not be repeated.

Referring to FIG. 8D, the electronic device 200 may include at least one magnet M1 and M2 arranged in the first housing 210 and the second housing 220. According to an embodiment, the at least one magnet M1 and M2 may include a first magnet M1 disposed in the first housing 210 and a second magnet M2 disposed in the second housing 220. According to an embodiment, when the electronic device 200 is in a folded state, the first magnet M1 and the second magnet M2 may be disposed at a corresponding position at which the first magnet M1 and the second magnet M2 can react to magnetic forces with respect to each other, and can thus assist in maintaining the folded state through the magnetic forces (e.g., human power).

According to various embodiments, the electronic device 200 may include a first shield member 491 for performing shielding so that the magnetic force of the first magnet M1 disposed in the first housing 210 does not influence the first digitizer 471 and/or the display panel 430, and a second shield member 492 for performing shielding so that the magnetic force of the second magnet M2 disposed in the second housing 220 does not influence the second digitizer 472 and/or the display panel 430. According to an embodiment, the first shield member 491 overlaps with the first waterproof member 481 disposed on the first reinforced plate 461, a waterproof function may not be performed due to generation of a step. Accordingly, the first shield member 491 may be disposed between the first digitizer 471 and the first support member 261 in an area in which at least a part of the first metal sheet layer and the first reinforced plate 461 are excluded, in order to avoid the first waterproof member 481 and receive the thickness of the first shield member 491. According to an embodiment, the second shield member 492 may be disposed through a laminate structure in which the bending portion 432 is disposed, in an area corresponding to the second housing 220. According to an embodiment, the second shield member 492 may be disposed between the second digitizer 472 and the first adhesive member T1 for attaching the extension unit 4321 to the second reinforced plate 462, in an area in which the second reinforced plate 462 and the second metal sheet player 4722 are omitted. For example, the thickness of the second shield member 492 may be formed with a thickness identical to a thickness obtained by summating thicknesses of the second reinforced plate 462 and the second metal sheet layer 4722.

Figure 9:
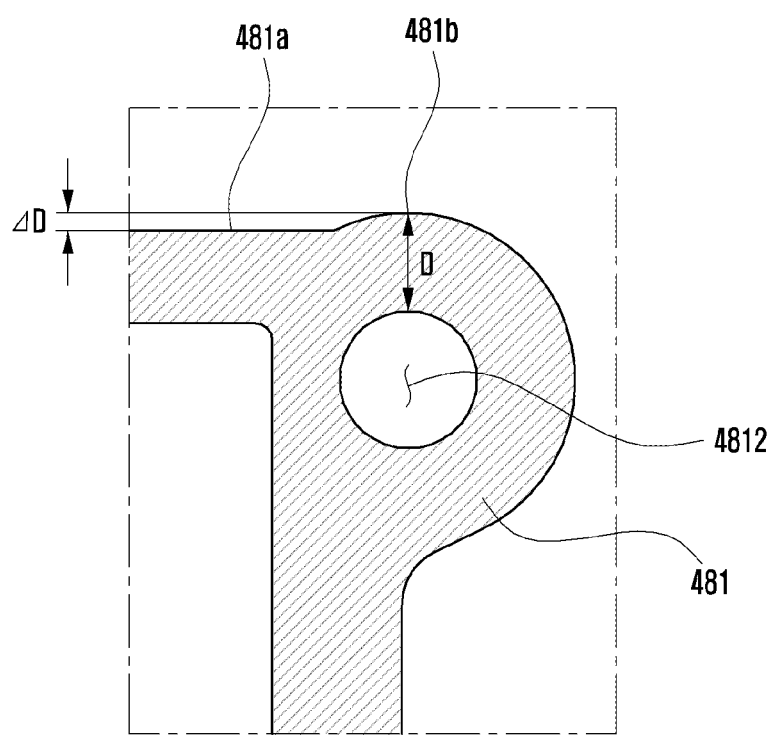
FIG. 9 is an enlarged view illustrating area 9 in FIG. 6, according to various embodiments.

FIG. 9 is an enlarged view illustrating area 9 in FIG. 6, according to various embodiments.

Referring to FIG. 9, a second waterproof space 4812 formed through a first waterproof member 481 may be disposed near an edge 481a (e.g., an edge) of the first waterproof member 481 to correspond to a module receiving hole (e.g., the module receiving hole 2612 of FIG. 7) of a first support member (e.g., the first support member 261 of FIG. 7). This is because, in a case where at least one electronic component disposed through the module receiving hole 2612 corresponds to a camera module and/or a sensor module, it is advantageous to configure a large screen when the second waterproof space 4812 is disposed closer to the edge of the flexible display 230. In this case, the distance from the second waterproof space 4812 to the edge 481a of the first waterproof member 481 may become narrow, which makes implementation of a waterproof function difficult.

According to an example embodiment of the disclosure, the first waterproof member 481 may include a protrusion 481b having an extended distance D obtained through protrusion by a designated distance ΔD from the edge 481a. According to an embodiment, the protrusion 481b may be formed as a shape corresponding to the shape of the second waterproof space 4812, so that the first waterproof member 481 may induce the distance D from the second waterproof space 4812 to the edge 481a to be uniform, and can thus assist in stably implementing the waterproof function. According to an embodiment, when the second waterproof space 4812 has a circular shape, the protrusion 481b may be formed to have a curved shape having a curvature, which corresponds to the circular shape.

Figure 10:
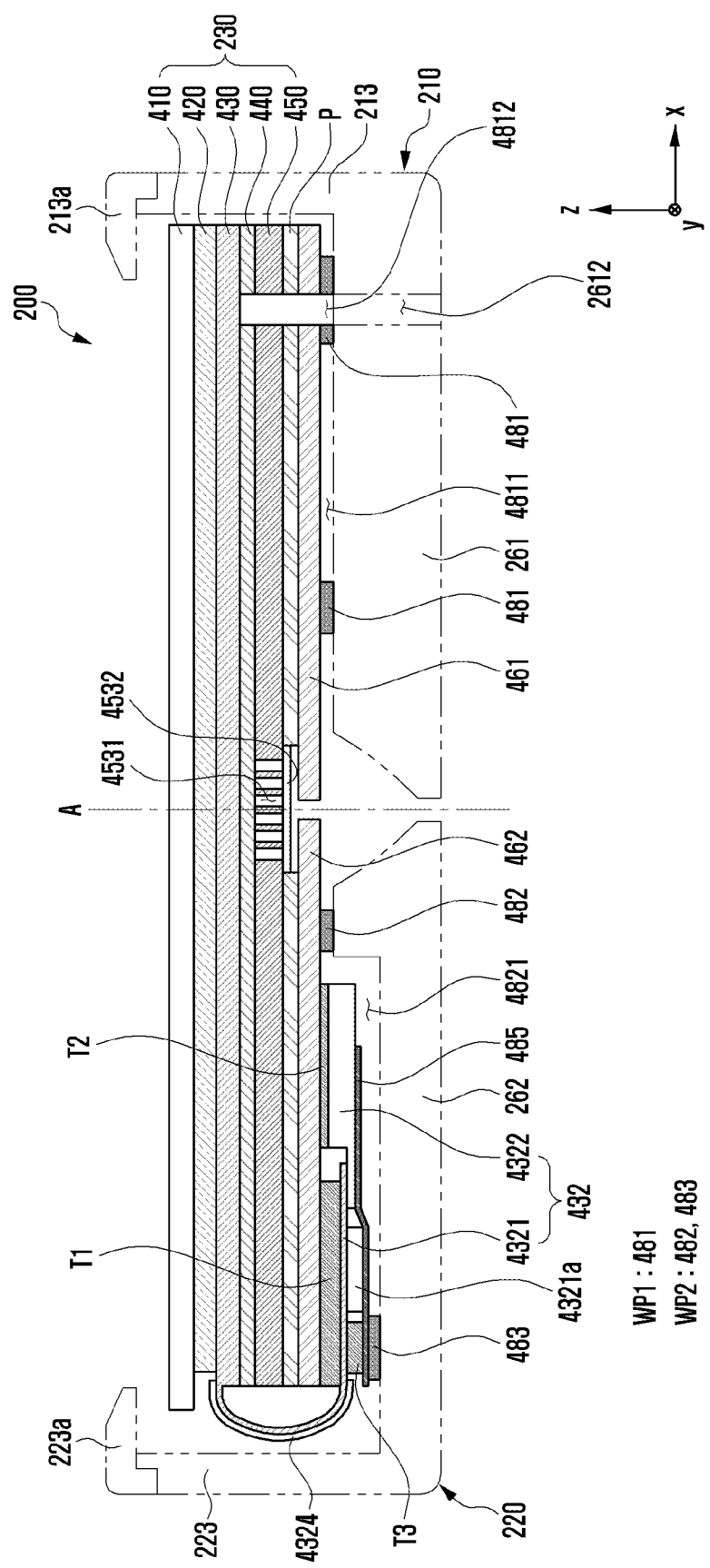
FIG. 10 is a cross-sectional view illustrating an electronic device according to various embodiments.

FIG. 10 is a cross-sectional view illustrating an electronic device according to various embodiments.

In describing an electronic device 200 of FIG. 10, the same reference numerals are assigned to elements that are substantially the same as or similar to those of the electronic device 200 of FIG. 8A, and a detailed description thereof may not be repeated.

Referring to FIG. 10, the electronic device 200 may be configured by excluding a digitizer (e.g., the digitizer 470 of FIG. 8A) and conductive sheet layers (e.g., the conductive sheet layers 4712 and 4722 of FIG. 8A). In this case, the first reinforced plate 461 may be attached to the support plate 450 through the adhesive member P. According to an embodiment, the second reinforced plate 462 may be also attached to the support plate 450 through the adhesive member P. According to an embodiment, the electronic device 200 may include a first waterproof structure WP1 disposed between the first reinforced plate 461 and the first support member 261 of the first housing 210, and a second waterproof structure WP2 disposed between the second reinforced plate 462 and the second support member 262 of the second housing 220. According to an embodiment, a configuration of arranging the first waterproof structure WP1 and the second waterproof structure WP2 may be substantially identical to that in FIG. 8A.

Figure 11A:
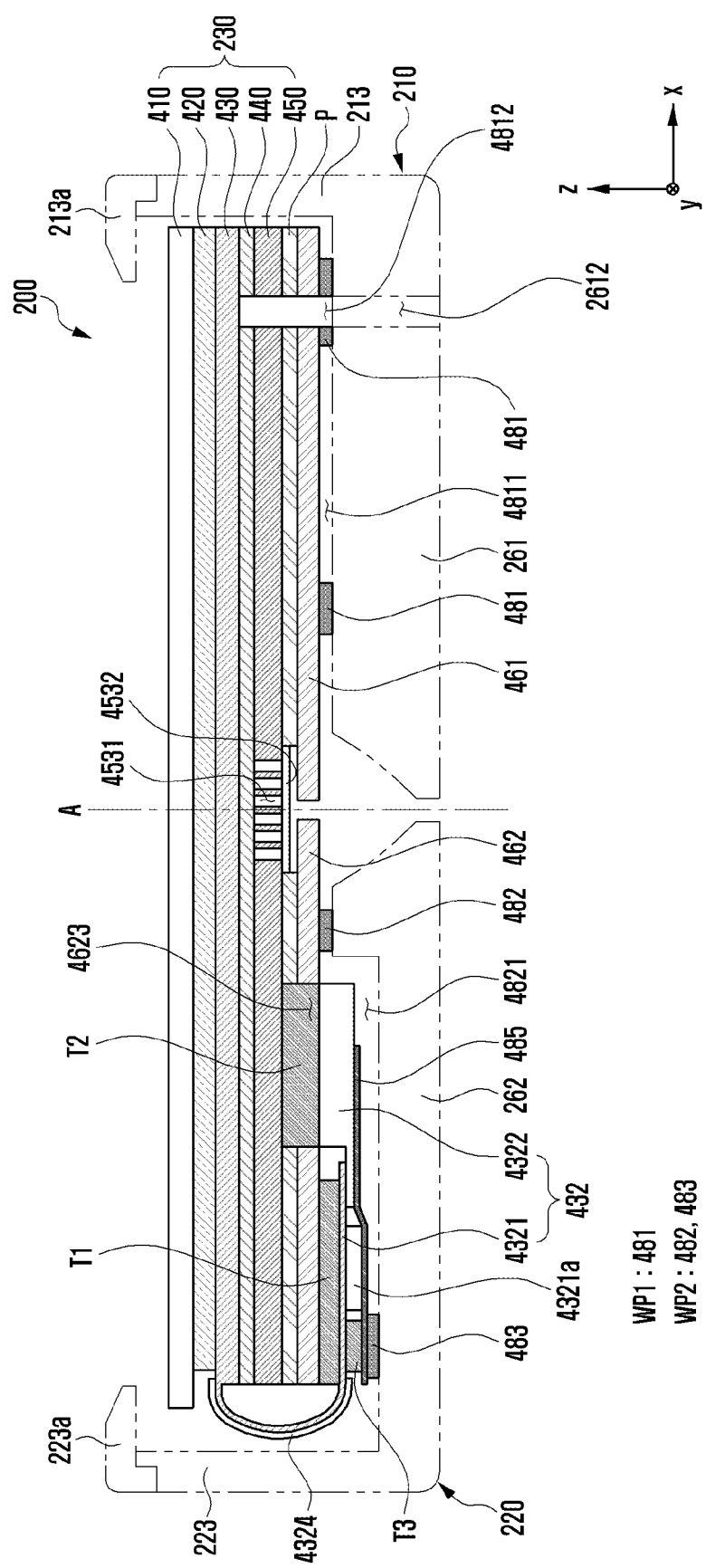
FIG. 11A is a cross-sectional view illustrating an electronic device according to various embodiments.
Figure 11B:
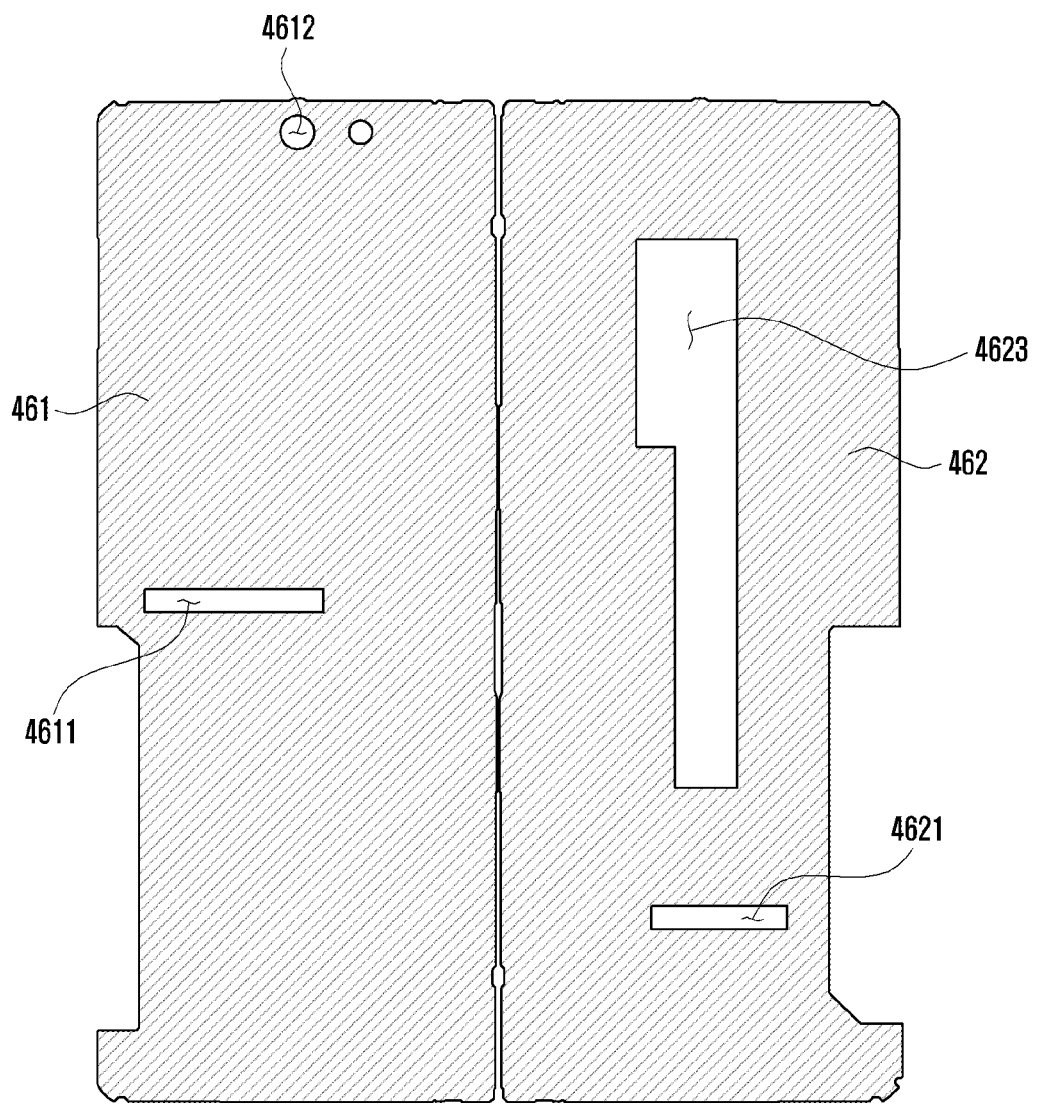
FIG. 11B is a diagram illustrating an example configuration of reinforced plates applied to FIG. 11A, according to various embodiments.

FIG. 11A is a cross-sectional view illustrating an electronic device according to various embodiments. FIG. 11B is a diagram illustrating an example configuration of reinforced plates applied to FIG. 11A, according to various embodiments.

In describing an electronic device 200 of FIG. 11A, the same reference numerals are assigned to elements that are substantially the same as or similar to those of the electronic device 200 of FIG. 10, and a detailed description thereof may not be repeated.

Referring to FIGS. 11A and 11B, in the electronic device 200 of FIG. 10, the bending portion 432 of the display panel 430 disposed in an area corresponding to the second housing 220 may be disposed to be laminated on the second reinforced plate 462. In this case, the flexible substrate 4322 and the second adhesive member T2, each of which has a relatively greater thickness, may make the thickness of the electronic device 200 to be greater in the z-axis direction, which may become a cause of adverse contribution to slimming of the size of the electronic device 200.

According to an example embodiment of the disclosure, the first reinforced plate 461 may include a third through-hole 4623 formed in an area corresponding to the second adhesive member T2. According to an embodiment, the third through-hole 4623 may have a shape and a size which allow at least a part of the second adhesive member T2 to extend therethrough. Accordingly, the second adhesive member T2 may come into contact with the support plate 450 after extending through the third through-hole 4623, and thus, the entire lamination height of the bending portion 432 may be lowered. In this case, for ground connection of the flexible substrate 4322, the support plate 450 may be formed of a conductive material (e.g., a metal material). In an embodiment, the third through-hole 4623 may have a size and a shape which allow at least a part of the flexible substrate 4322 and the second adhesive member T2 to be received therein.

Figure 12:
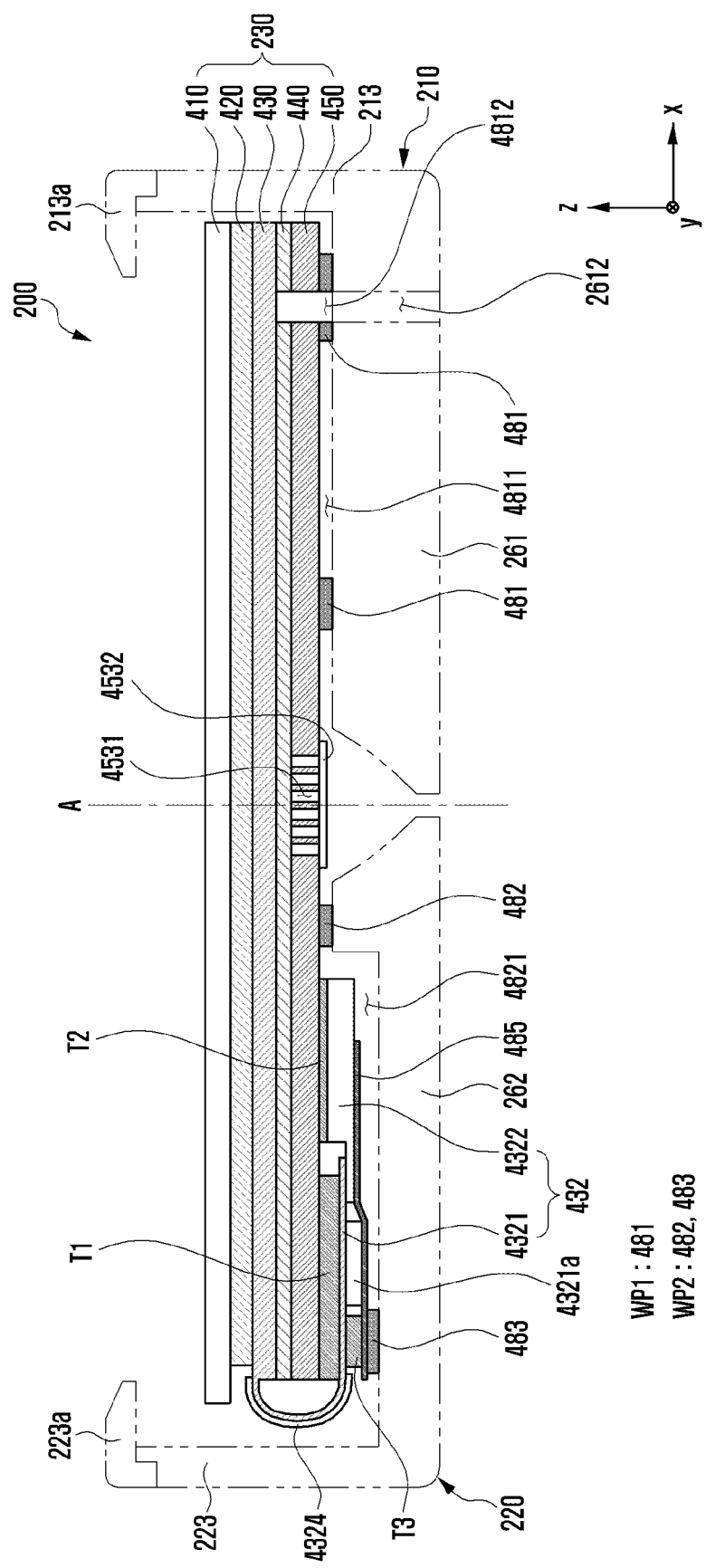
FIG. 12 is a cross-sectional view illustrating an electronic device according to various embodiments.

FIG. 12 is a cross-sectional view illustrating an electronic device according to various embodiments.

In describing an electronic device 200 of FIG. 12, the same reference numerals are assigned to elements that are substantially the same as or similar to those of the electronic device 200 of FIG. 8A, and a detailed description thereof may not be repeated.

Referring to FIG. 12, the electronic device 200 may be configured by excluding a digitizer (e.g., the digitizer 470 of FIG. 8A), conductive sheet layers (e.g., the conductive sheet layers 4712 and 4722 of FIG. 8A), and reinforced plates (e.g., the reinforced plates 461 and 462 of FIG. 8A). According to an embodiment, the electronic device 200 may include a first waterproof space 4811 provided through the first waterproof member 481 disposed between the first support member 261 of the first housing 210 and the support plate 450, a second waterproof space (e.g., the second waterproof space 4812 of FIG. 7), or a third waterproof space (e.g., the third waterproof space 4813 of FIG. 7).

According to an embodiment, the electronic device 200 may include a fourth waterproof space 4821 provided through the second waterproof member 482 disposed between the support plate 450 and the second support member 262 of the second housing 220, the third waterproof member 483, and a fourth waterproof member (e.g., the fourth waterproof member 484 of FIG. 7). In this case, the support plate 450 may be formed of a conductive material (e.g., a metal material) to come into ground contact with the flexible substrate 4322 disposed on the bending portion 432 of the display panel 430.

In an embodiment, when the electronic device 200 includes at least one digitizer (e.g., the digitizers 471 and 472 of FIG. 8A), the at least one digitizer (e.g., the digitizers 471 and 472 of FIG. 8A) may be disposed in the waterproof space under the support plate 450. In an embodiment, the waterproof members 481, 482, 483, and 484 may be arranged between the support members 261 and 262 and the at least one digitizer 471 and 472. In an embodiment, the at least one digitizer 471 and 472 may be disposed between the polymer layer 440 and the support plate 450.

According to various example embodiments, an electronic device (e.g., the electronic device 200 of FIG. 3) may include: a first housing (e.g., the first housing 210 of FIG. 3) including a first support (e.g., a first support member 261 of FIG. 3), a second housing (e.g., the second housing 220 of FIG. 3) including a second support (e.g., the second support member 262 of FIG. 3) and foldably coupled to the first housing through a hinge (e.g., the hinge device 320 of FIG. 3), a display panel (e.g., the display panel 430 of FIG. 4) supported by the first housing and the second housing, a support plate (e.g., the support plate 450 of FIG. 3) disposed under the display panel, a first reinforced plate (e.g., the first reinforced plate 461 of FIG. 3) at least partially disposed under the support plate and corresponding to the first support, a second reinforced plate (e.g., the second reinforced plate 462 of FIG. 3) at least partially disposed under the support plate and corresponding to the second support, a first waterproof structure comprising a waterproof material (e.g., the first waterproof structure WP1 of FIG. 7) disposed between the first housing and the first reinforced plate to define at least one first waterproof space (e.g., the first waterproof space 4811, the second waterproof space 4812, or the third waterproof space 4813 of FIG. 7), and a second waterproof structure comprising a waterproof material (e.g., the second waterproof structure WP2 of FIG. 7) disposed between the second housing and the second reinforced plate to define at least one second waterproof space (e.g., the fourth waterproof space 4821 of FIG. 7).

According to various example embodiments, the first reinforced plate and the second reinforced plate may comprise a metal material.

According to various example embodiments, at least one digitizer disposed under the support plate may be included.

According to various example embodiments, the at least one digitizer may include a first digitizer disposed between the support plate and the first reinforced plate corresponding to the first support, and including a first flexible printed circuit board (FPCB) connection portion, and a second digitizer disposed between the support plate and the second reinforced plate corresponding to the second support, and including a second FPCB connection portion.

According to various example embodiments, the first reinforced plate may include a first through-hole formed through an area overlapping with the at least one first waterproof space when seen from above the flexible display, the first support may include a first support through-hole formed through an area overlapping with the at least one first waterproof space when seen from above the flexible display, and the first FPCB connection portion may be electrically connected to a first substrate disposed in a first space of the first housing through the first through-hole and the first support through-hole.

According to various example embodiments, the second reinforced plate may include a second through-hole formed through an area overlapping the at least one second waterproof space when seen from above the flexible display, the second support may include a second support through-hole formed through an area overlapping the at least one second waterproof space when seen from above the flexible display, and the second FPCB connection portion may be electrically connected to a second substrate disposed in a second space of the second housing through the second through-hole and the second support through-hole.

According to various example embodiments, the first substrate and the second substrate may be electrically connected through at least one wire disposed to cross from the first space to the second space.

According to various example embodiments, a first metal sheet layer disposed between the first digitizer and the first reinforced plate, and a second metal sheet layer disposed between the second digitizer and the second reinforced plate may be further included.

According to various example embodiments, the first waterproof structure may include a first waterproof portion disposed between the first support and the first reinforced plate.

According to various example embodiments, the at least one waterproof space may be disposed near an edge of the first waterproof portion, and the first waterproof portion may include a protrusion extending to allow an edge corresponding to the at least one first waterproof space to protrude over a surrounding edge.

According to various example embodiments, the first waterproof portion may include at least one of tape, an adhesive, waterproof dispensing, silicone, waterproof rubber, or urethane.

According to various example embodiments, the flexible display may include a window layer, a display panel disposed under the window layer, an extension portion extending from the display panel and including a control circuit, a bending portion connected to the extension portion and including a flexible substrate including an FPCB connection portion, and a cover disposed to cover at least a part of the flexible substrate and the extension portion, wherein the bending portion is disposed so that the bending portion is bent over a rear surface of the flexible display and is attached to the second reinforced plate, and the FPCB connection portion is disposed, when seen from above the flexible display, at a position overlapping with the at least one second waterproof space.

According to various example embodiments, the second support may include a second support through-hole formed, when seen from above the flexible display, in an area corresponding to the FPCB connection portion, and the FPCB connection portion may be electrically connected to a substrate disposed in a second space of the second housing through the second support through-hole.

According to various example embodiments, the second reinforced plate may include a through-hole formed at a position corresponding to the flexible substrate, and the flexible substrate may be attached to the support plate through an adhesive at least partially extending through the through-hole.

According to various example embodiments, the adhesive may include conductive tape.

According to various example embodiments, the second waterproof structure may include a first waterproof portion disposed to surround at least a part of the bending portion on the second reinforced plate, a second waterproof portion disposed on the cover at a position spaced apart from the first waterproof portion, and a third water proof portion configured to connect the first waterproof portion and the second waterproof portion in a space between the first waterproof portion and the second waterproof portion spaced apart from each other, wherein the at least one second waterproof space is provided through the first waterproof portion, the second waterproof portion, and the third waterproof portion.

According to various example embodiments, the first waterproof portion and the second waterproof portion may include at least one of tape, an adhesive, waterproof dispensing, silicone, waterproof rubber, or urethane, and the third waterproof portion includes cured in place gaskets (CIPGs) including a semisolid or a liquid material having a characteristic of naturally solidifying or solidifying by an external condition.

According to various example embodiments, an electronic device (e.g., the electronic device 200 of FIG. 3) may include: a first housing (e.g., the first housing 210 of FIG. 3) including a first support (e.g., the first support member 261 of FIG. 3), a second housing (e.g., the second housing 220 of FIG. 3) including a second support (e.g., the second support member 262 of FIG. 3) and foldably coupled to the first housing through a hinge (e.g., the hinge device 320 of FIG. 3), a display panel (e.g., the display panel 430 of FIG. 4) supported by the first housing and the second housing, a support plate (e.g., the support plate 450 of FIG. 3) disposed under the display panel, a first digitizer (e.g., the first digitizer 471 of FIG. 8A) disposed under the support plate and corresponding to the first support, and including a first flexible printed circuit board (FPCB) connection portion (e.g., the first FPCB connection portion 4711 of FIG. 6), a second digitizer (e.g., the second digitizer 472 of FIG. 8A) disposed under the support plate and corresponding to the second support, and including a second FPCB connection portion (e.g., the second FPCB connection portion 4721 of FIG. 6), a first reinforced plate (e.g., the first reinforced plate 461 of FIG. 3) disposed under the first digitizer corresponding to the first support, a second reinforced plate (e.g., the second reinforced plate 462 of FIG. 3) disposed under the second digitizer corresponding to the second support, a first waterproof structure comprising a waterproof material (e.g., the first waterproof structure WP1 of FIG. 7) disposed between the first housing and the first reinforced plate to define at least one first waterproof space (e.g., the first waterproof space 4811, the second waterproof space 4812, or the third waterproof space 4813 of FIG. 7), and a second waterproof structure comprising a waterproof material (e.g., the second waterproof structure WP2 of FIG. 7) disposed between the second housing and the second reinforced plate to define at least one second waterproof space (e.g., the fourth waterproof space 4821 of FIG. 7), wherein the first FPCB connection portion is disposed, when seen from above the flexible display, at a position overlapping with the at last one first waterproof space, and the second FPCB connection portion is disposed, when seen from above the flexible display, at a position overlapping with the at least one second waterproof space.

According to various example embodiments, the first reinforced plate may include a first through-hole formed through an area overlapping with the at least one first waterproof space when seen from above the flexible display, the first support may include a first support through-hole formed through an area overlapping with the at least one first waterproof space when seen from above the flexible display, and the first FPCB connection portion may be electrically connected to a first substrate disposed in a first space of the first housing through the first through-hole and the first support through-hole.

According to various example embodiments, the second reinforced plate may include a second through-hole formed through an area overlapping with the at least one second waterproof space when seen from above the flexible display, the second support may include a second support through-hole formed through an area overlapping with the at least one second waterproof space when seen from above the flexible display, and the second FPCB connection portion may be electrically connected to a second substrate disposed in a second space of the second housing through the second through-hole and the second support through-hole.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
   a first housing comprising a first support member;
   a second housing comprising a second support member and foldably coupled to the first housing through a hinge device;
   a display panel supported by the first housing and the second housing;
   a support plate disposed under the display panel;
   a first reinforced plate at least partially disposed under the support plate to correspond to the first support member;
   a second reinforced plate at least partially disposed under the support plate to correspond to the second support member;
   a first waterproof structure disposed between the first housing and the first reinforced plate to define at least one first waterproof space;
   a second waterproof structure disposed between the second housing and the second reinforced plate to define at least one second waterproof space; and
   a bending portion comprising an extension portion extending from the display panel and a flexible substrate connected to the extension portion, the flexible substrate comprising a flexible printed circuit board (FPCB) connection portion,
   wherein the bending portion is disposed so that the bending portion is bent and is attached to the second reinforced plate, and
   wherein the FPCB connection portion is disposed at a position overlapping with the at least one second waterproof space when the display panel is viewed from above.

2. The electronic device of claim 1, wherein the first reinforced plate and the second reinforced plate comprise a metal material.

3. The electronic device of claim 1, further comprising at least one digitizer disposed under the support plate.

4. The electronic device of claim 3, wherein the at least one digitizer comprises:
- a first digitizer disposed between the support plate and the first reinforced plate corresponding to the first support member, and comprising a first flexible printed circuit board (FPCB) connection portion; and
- a second digitizer disposed between the support plate and the second reinforced plate corresponding to the second support member, and comprising a second FPCB connection portion.

5. The electronic device of claim 4, wherein the first reinforced plate comprises a first through-hole formed through an area overlapping with the at least one first waterproof space when seen from above the display panel,
- wherein the first support member comprises a first member through-hole formed through an area overlapping with the at least one first waterproof space when seen from above the display panel, and
- wherein the first FPCB connection portion is electrically connected to a first substrate disposed in a first space of the first housing through the first through-hole and the first member through-hole.

6. The electronic device of claim 5, wherein the second reinforced plate comprises a second through-hole formed through an area overlapping the at least one second waterproof space when seen from above the display panel,
- wherein the second support member comprises a second member through-hole formed through an area overlapping the at least one second waterproof space when seen from above the display panel, and
- wherein the second FPCB connection portion is electrically connected to a second substrate disposed in a second space of the second housing through the second through-hole and the second member through-hole.

7. The electronic device of claim 6, wherein the first substrate and the second substrate are electrically connected through at least one wire member disposed to cross from the first space to the second space.

8. The electronic device of claim 4, further comprising:
- a first metal sheet layer disposed between the first digitizer and the first reinforced plate; and
- a second metal sheet layer disposed between the second digitizer and the second reinforced plate.

9. The electronic device of claim 1, wherein the first waterproof structure comprises a first waterproof member disposed between the first support and the first reinforced plate.

10. The electronic device of claim 9, wherein the at least one first waterproof space is disposed near an edge of the first waterproof member, and
- wherein the first waterproof member comprises a protrusion extending to allow an edge corresponding to the at least one first waterproof space to protrude over a surrounding edge.

11. The electronic device of claim 9, wherein the first waterproof member comprises at least one of tape, an adhesive, waterproof dispensing, silicone, waterproof rubber, or urethane.

12. The electronic device of claim 1, further comprising:
- a window layer disposed on the display panel; and
- a cover member disposed to cover at least a part of the flexible substrate and the extension portion,
- wherein the extension portion comprises a control circuit, the control circuit being disposed between the cover member and the extension.

13. The electronic device of claim 12, wherein the second support member comprises a member through-hole formed, when seen from above the flexible display, in an area corresponding to the FPCB connection portion, and
- wherein the FPCB connection portion is electrically connected to a substrate disposed in a second space of the second housing through the member through-hole.

14. The electronic device of claim 12, wherein the second reinforced plate comprises a through-hole formed at a position corresponding to the flexible substrate, and
- wherein the flexible substrate is attached to the support plate through an adhesive member at least partially extending through the through-hole.

15. The electronic device of claim 14, wherein the adhesive member comprises conductive tape.

16. The electronic device of claim 12, wherein the second waterproof structure comprises:
- a first waterproof member disposed to surround at least a part of the bending portion on the second reinforced plate;
- a second waterproof member disposed on the cover member at a position spaced apart from the first waterproof member; and
- a third waterproof member configured to connect the first waterproof member and the second waterproof member in a space between the first waterproof member and the second waterproof member spaced apart from each other, and
- wherein the at least one second waterproof space is provided through the first waterproof member, the second waterproof member, and the third waterproof member.

17. The electronic device of claim 16, wherein the first waterproof member and the second waterproof member comprise at least one of tape, an adhesive, waterproof dispensing, silicone, waterproof rubber, or urethane, and
- wherein the third waterproof member comprises cured in place gaskets (CIPGs) comprising a semisolid or a liquid material having a characteristic of naturally solidifying or solidifying by an external condition.

18. An electronic device comprising:
- a first housing comprising a first support member;
- a second housing comprising a second support member and foldably coupled to the first housing through a hinge;
- a display panel supported by the first housing and the second housing;
- a support plate disposed under the display panel;
- a first digitizer disposed under the support plate and corresponding to the first support member, and comprising a first flexible printed circuit board (FPCB) connection portion;
- a second digitizer disposed under the support plate and corresponding to the second support member, and comprising a second FPCB connection portion;
- a first reinforced plate disposed under the first digitizer corresponding to the first support member;
- a second reinforced plate disposed under the second digitizer corresponding to the second support member;
- a first waterproof structure disposed between the first housing and the first reinforced plate to define at least one first waterproof space; and
- a second waterproof structure disposed between the second housing and the second reinforced plate to define at least one second waterproof space, wherein the first FPCB connection portion is disposed, when seen from above the flexible display, at a position overlapping with the at least one first waterproof space, and wherein the second FPCB connection portion is disposed, when seen from above the flexible display, at a position overlapping with the at least one second waterproof space.

19. The electronic device of claim 18, wherein the first reinforced plate comprises a first through-hole formed through an area overlapping with the at least one first waterproof space when seen from above the flexible display, wherein the first support member comprises a first member through-hole formed through an area overlapping with the at least one first waterproof space when seen from above the flexible display, and wherein the first FPCB connection portion is electrically connected to a first substrate disposed in a first space of the first housing through the first through-hole and the first member through-hole.

20. The electronic device of claim 18, wherein the second reinforced plate comprises a second through-hole formed through an area overlapping with the at least one second waterproof space when seen from above the flexible display, wherein the second support member comprises a second member through-hole formed through an area overlapping with the at least one second waterproof space when seen from above the flexible display, and wherein the second FPCB connection portion is electrically connected to a second substrate disposed in a second space of the second housing through the second through-hole and the second member through-hole.

* * * * *